(12) United States Patent
Honda

(10) Patent No.: US 8,406,066 B2
(45) Date of Patent: *Mar. 26, 2013

(54) NONVOLATILE SEMICONDUCTOR MEMORY DEVICE

(75) Inventor: Yasuhiko Honda, Hiratsuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/417,954

(22) Filed: Mar. 12, 2012

(65) Prior Publication Data

US 2012/0170381 A1 Jul. 5, 2012

Related U.S. Application Data

(63) Continuation of application No. 12/884,878, filed on Sep. 17, 2010, now Pat. No. 8,159,884.

(30) Foreign Application Priority Data

Dec. 25, 2009 (JP) ................................ 2009-296343

(51) Int. Cl.
*G11C 7/12* (2006.01)
(52) U.S. Cl. ......... 365/189.06; 365/185.02; 365/185.23; 365/185.25; 365/189.15
(58) Field of Classification Search ............ 365/185.02, 365/185.23, 185.25, 189.15, 189.06
See application file for complete search history.

(56) References Cited

U.S. PATENT DOCUMENTS

| 4,852,064 | A | * | 7/1989 | Kim et al. ............... 365/203 |
| 5,038,324 | A | * | 8/1991 | Oh .................. 365/189.14 |
| 6,438,038 | B2 | | 8/2002 | Ikehashi et al. |
| 6,469,929 | B1 | * | 10/2002 | Kushnarenko et al. .. 365/185.06 |
| 6,674,668 | B2 | | 1/2004 | Ikehashi et al. |
| 7,486,562 | B2 | | 2/2009 | Ogawa et al. |
| 7,701,777 | B2 | | 4/2010 | Ogawa et al. |
| 8,159,884 | B2 | * | 4/2012 | Honda ................ 365/189.06 |
| 2011/0292736 | A1 | | 12/2011 | Honda |

FOREIGN PATENT DOCUMENTS

| JP | 2000-48585 | 2/2000 |
| JP | 2006-147111 | 6/2006 |

* cited by examiner

*Primary Examiner* — Hoai V Ho
*Assistant Examiner* — Jay Radke
(74) *Attorney, Agent, or Firm* — Oblon, Spivak, McClelland, Maier & Neustadt, L.L.P.

(57) ABSTRACT

According to one embodiment, a nonvolatile semiconductor memory device includes a memory cell transistor, a word line, a row decoder, a sense amplifier which determines the data in the memory cell transistor via the bit line, a first bit line clamp transistor connected in series between the bit line and the sense amplifier, a second bit line clamp transistor connected in parallel to the first bit line clamp transistor and having a current driving capability higher than that of the first bit line clamp transistor, and a bit line control circuit which turns on the first bit line clamp transistor and the second bit line clamp transistor using a common gate voltage during a predetermined period from a start of charge of the bit line, and turns off only the second bit line clamp transistor when the predetermined period has elapsed.

6 Claims, 20 Drawing Sheets

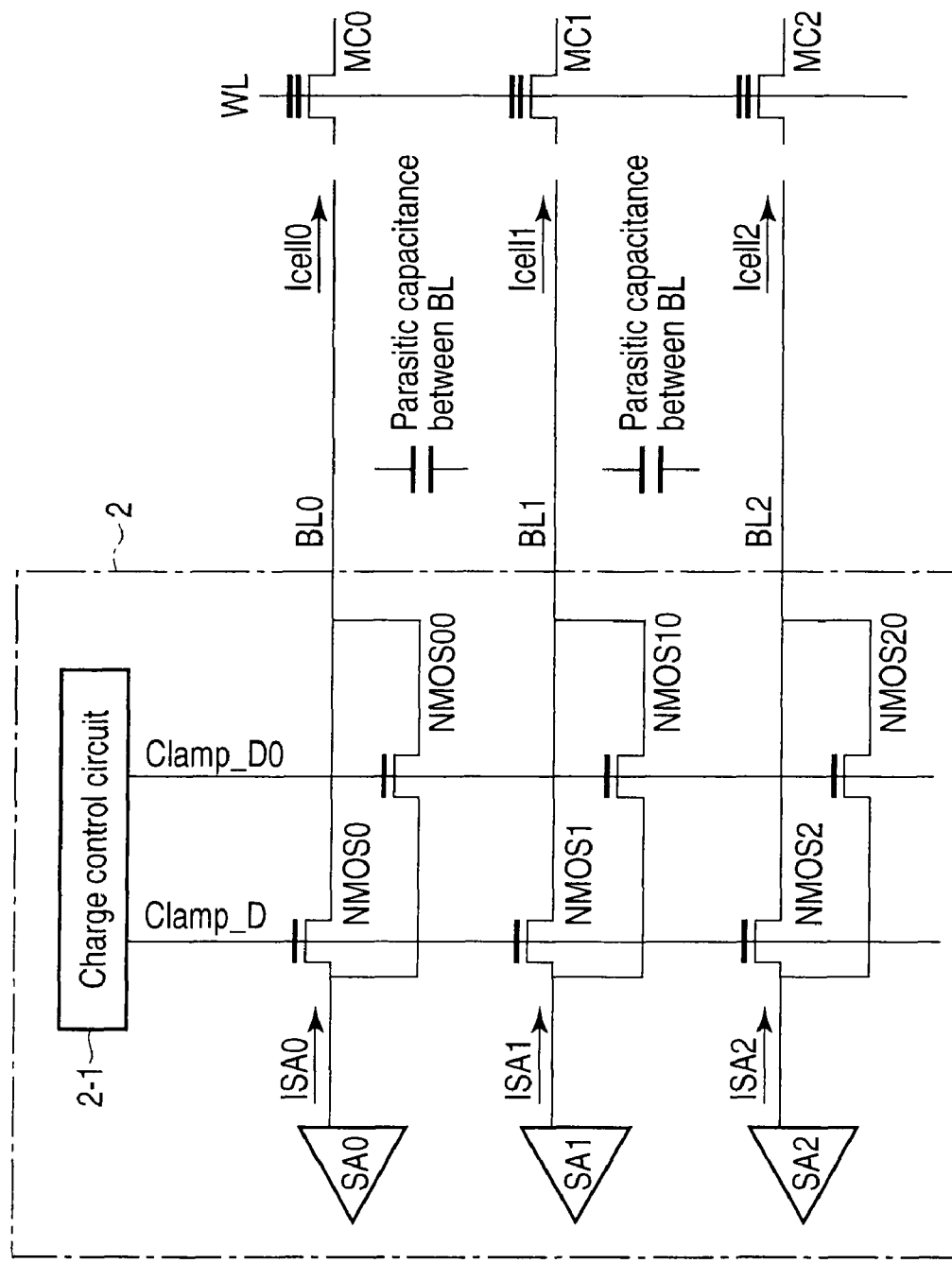
F I G. 3

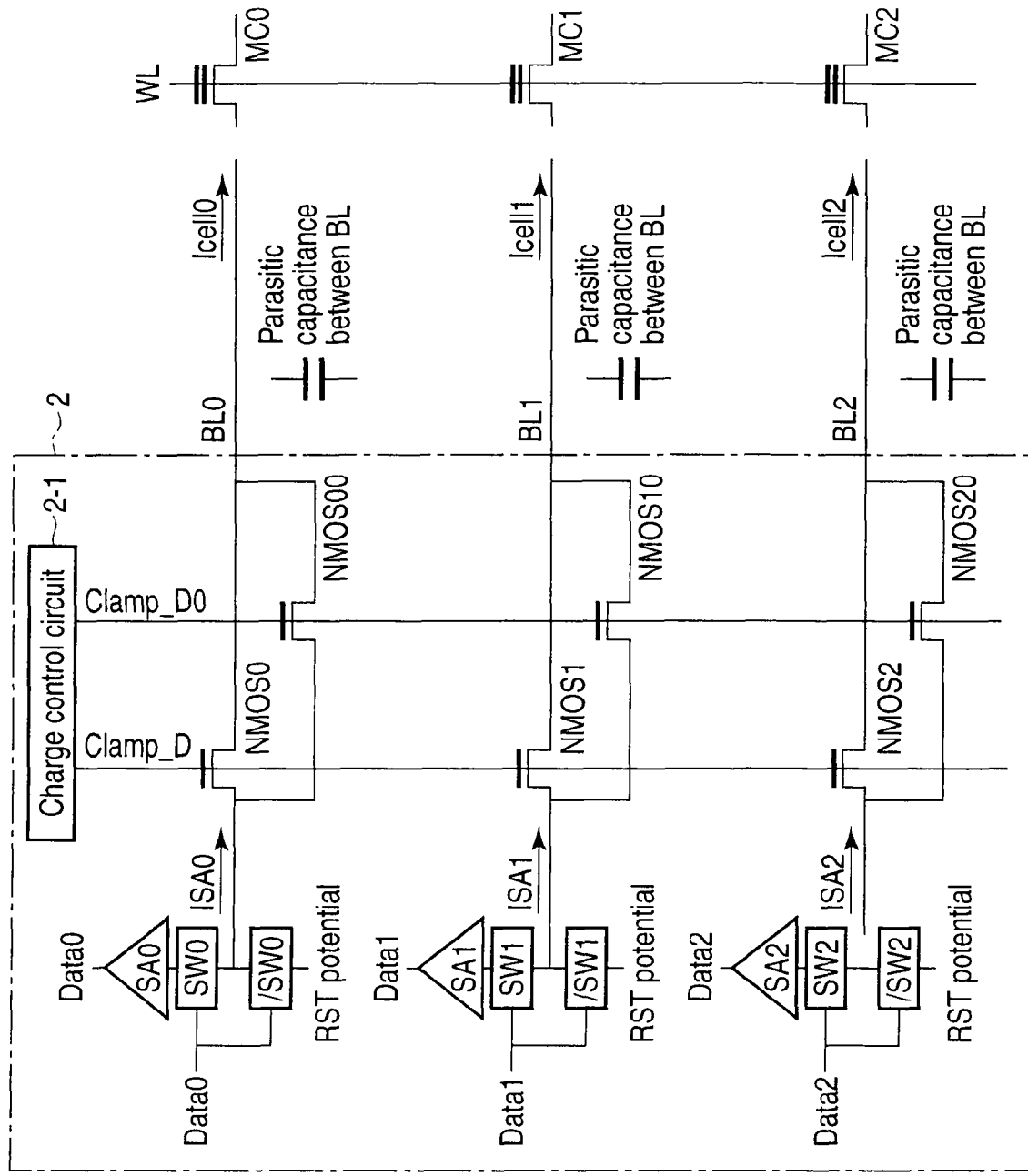
F I G. 8

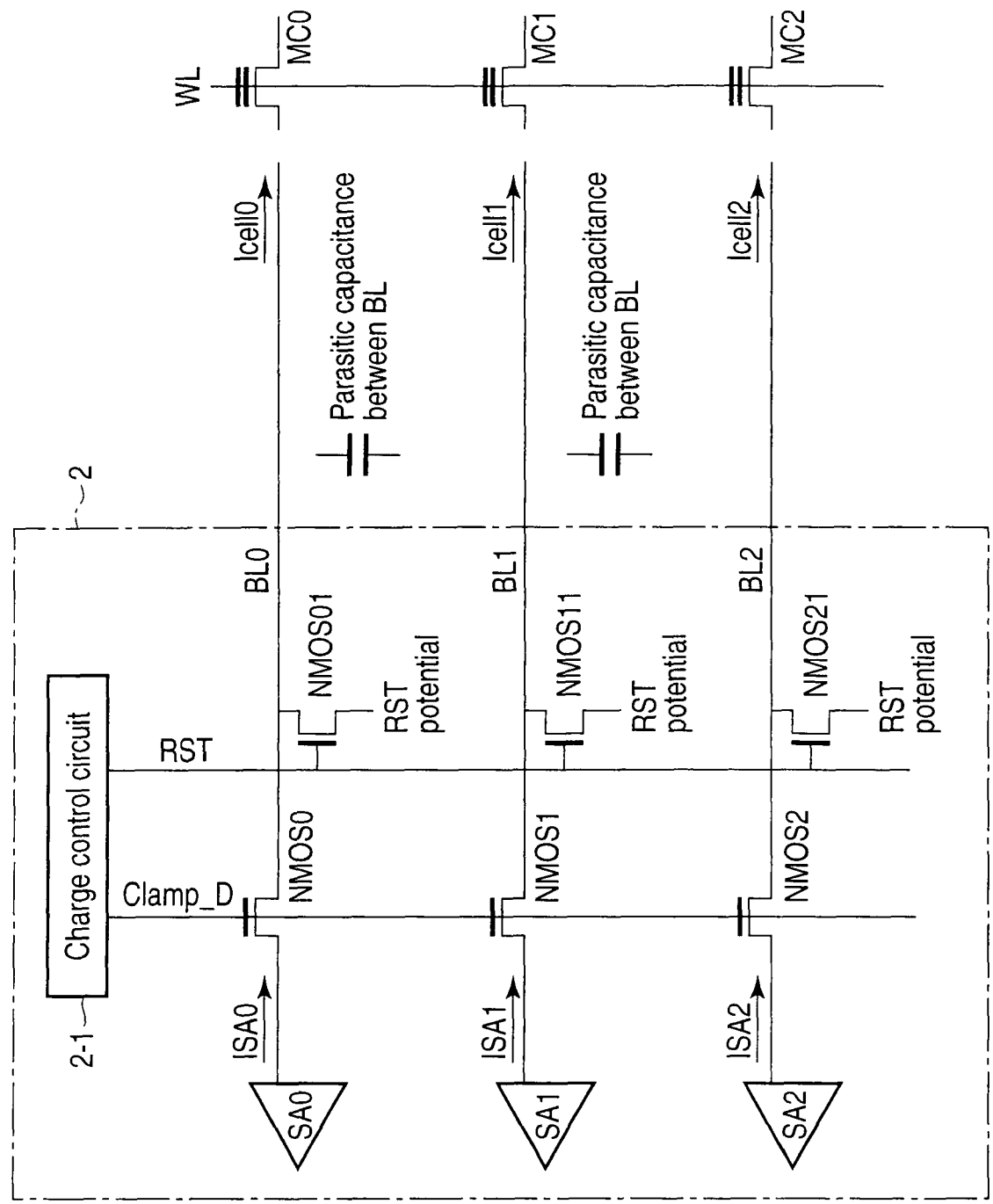
F I G. 10

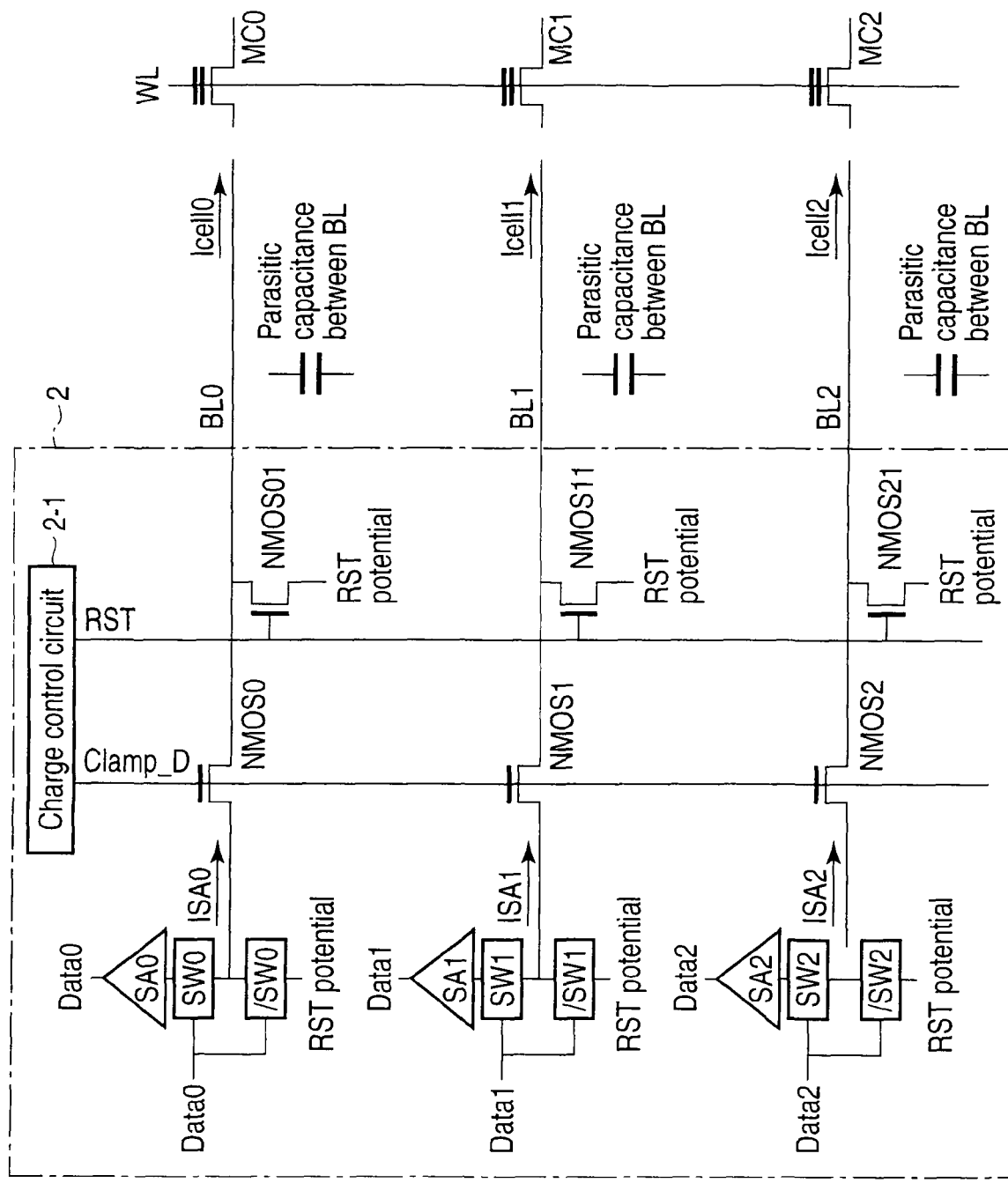
F I G. 12

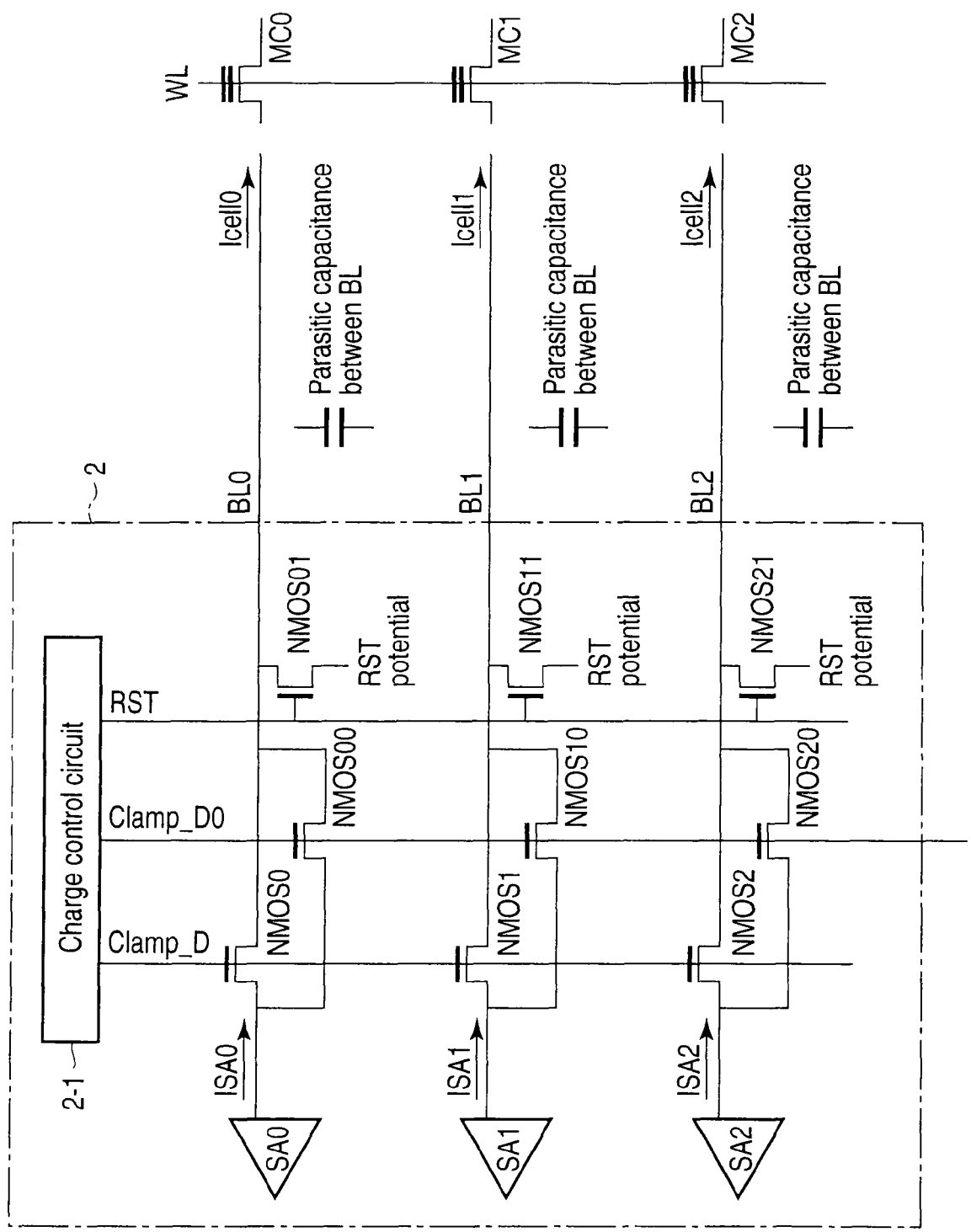
F I G. 14

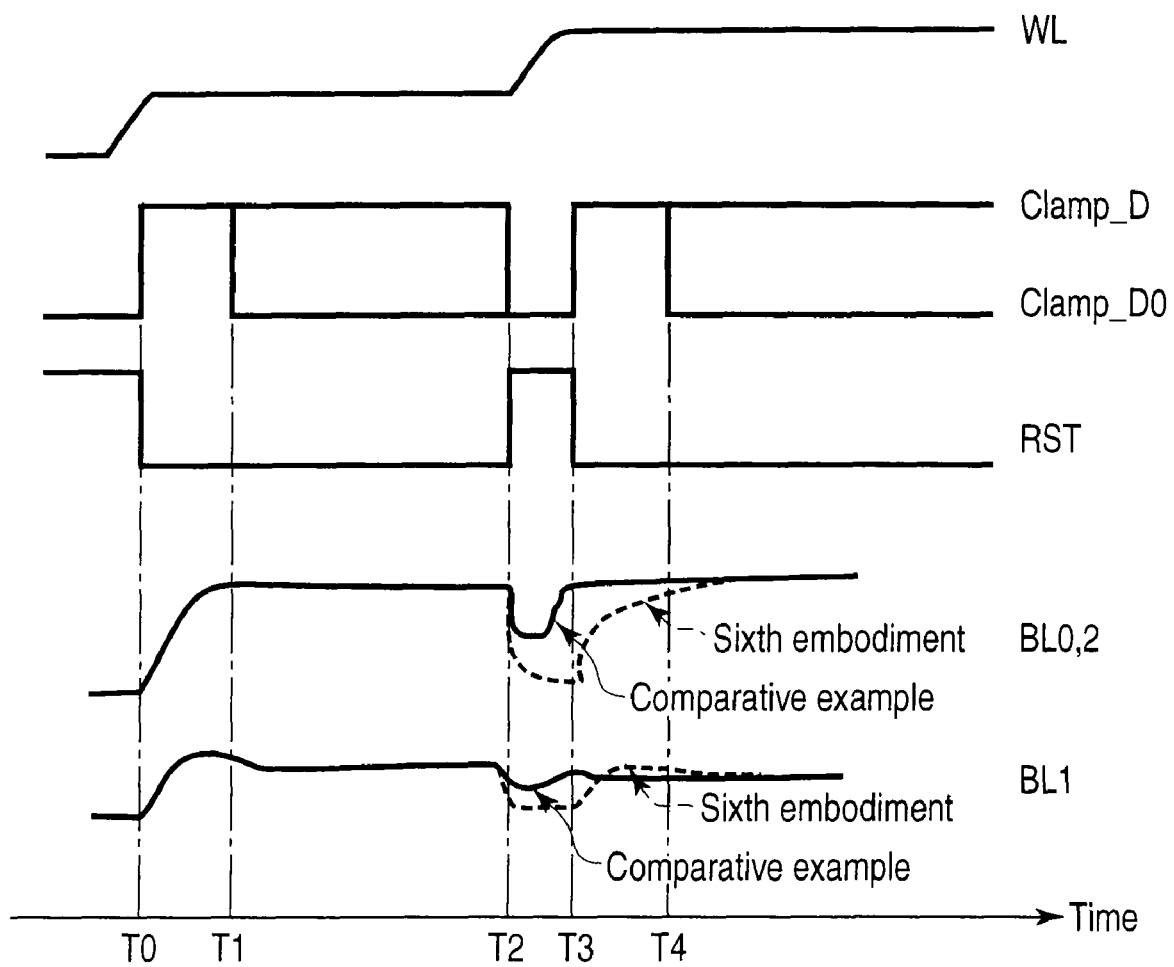
F I G. 1 5

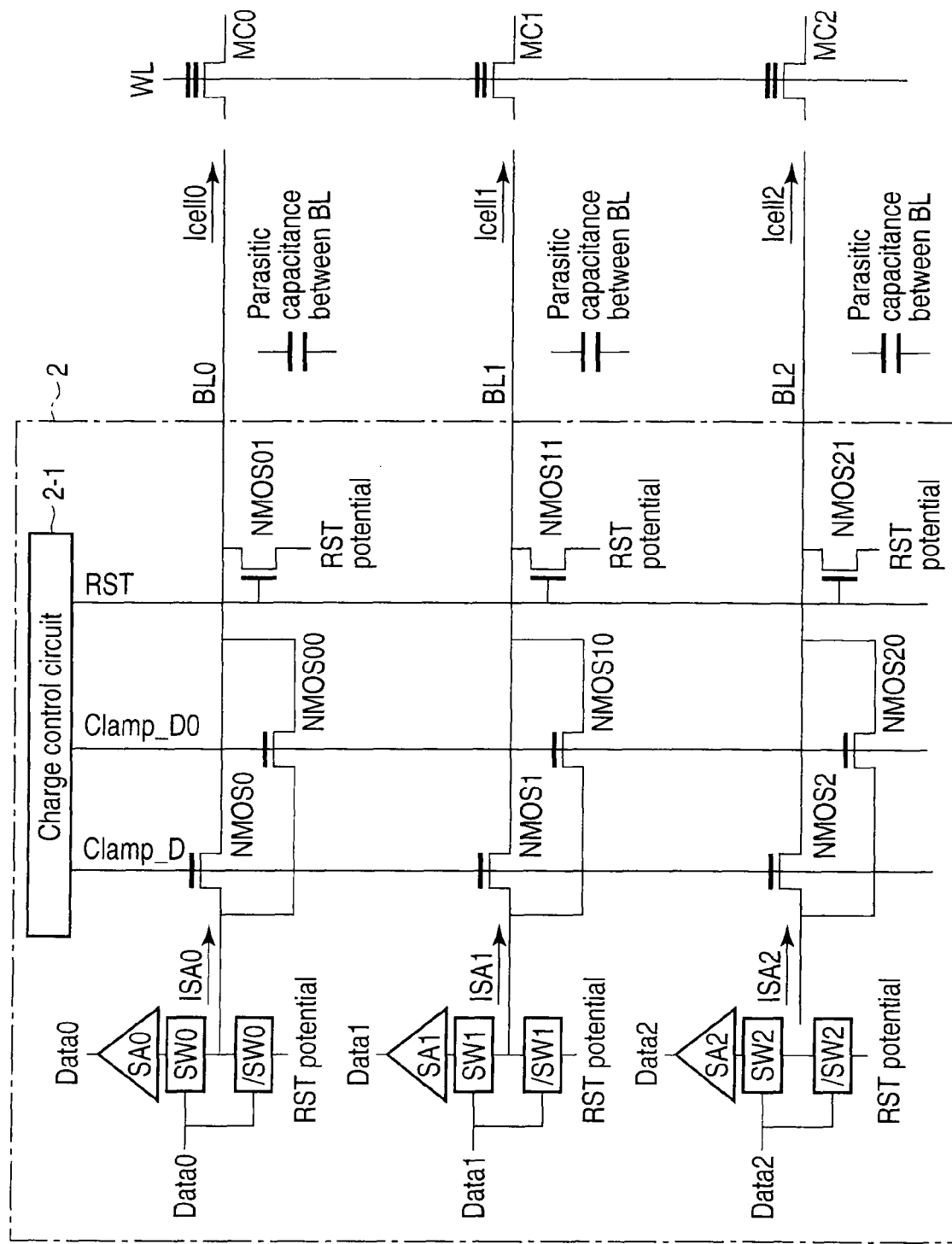
F I G. 16

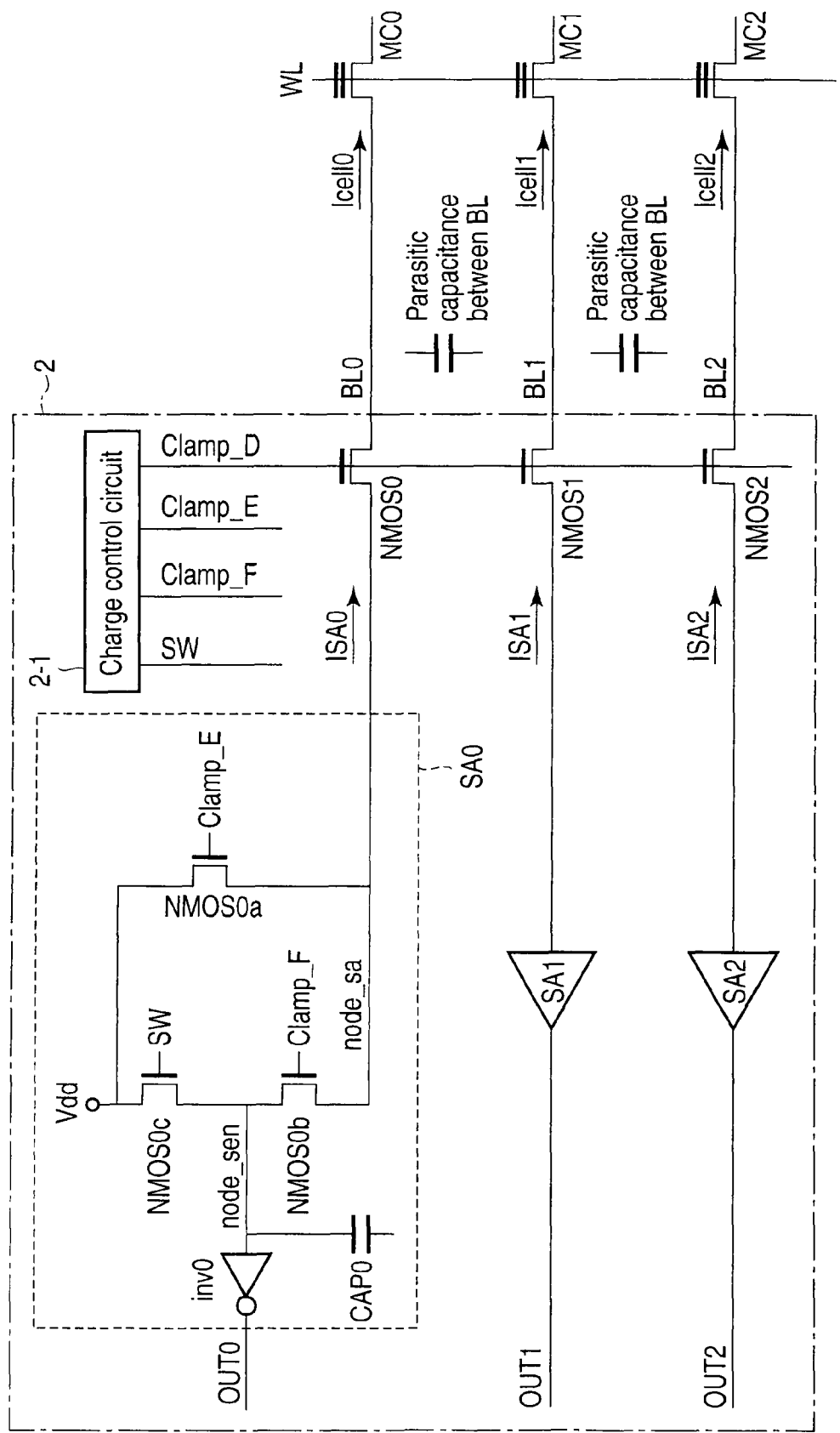
F I G. 18

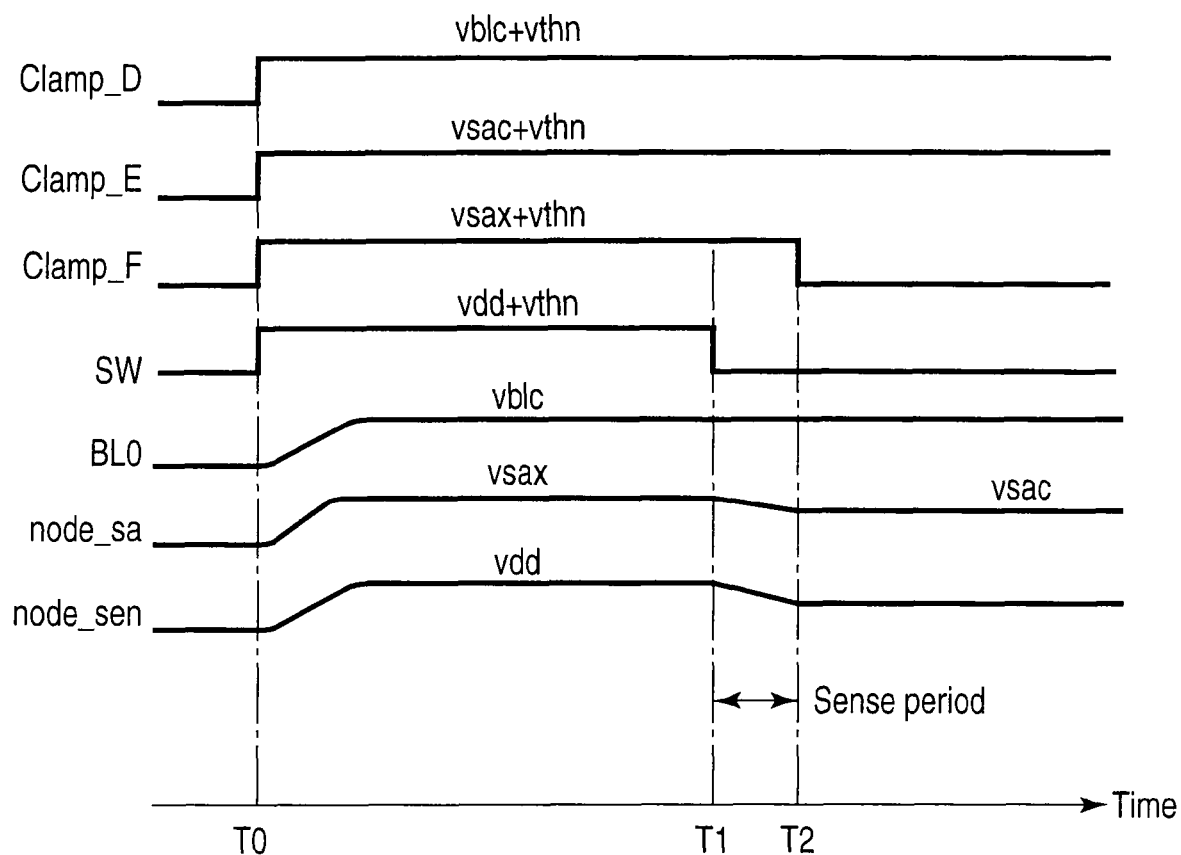
F I G. 1 9

US 8,406,066 B2

NONVOLATILE SEMICONDUCTOR MEMORY DEVICE

CROSS-REFERENCE TO RELATED APPLICATIONS

This application is a continuation of U.S. application Ser. No. 12/884,878 filed Sep. 17, 2010, and is based upon and claims the benefit of priority from Japanese Patent Application No. 2009-296343, filed Dec. 25, 2009; the entire contents of each of which are incorporated herein by reference.

FIELD

Embodiments described herein relate generally to a nonvolatile semiconductor memory device.

BACKGROUND

The read characteristic of a NAND flash memory is mainly rate-determined by charge of bit lines. In such a NAND flash memory, the decrease of memory cell currents and mutual interference to an adjacent bit line or a second adjacent bit line become conspicuous, and the read characteristic tends to degrade along with advance in micropatterning of the manufacturing process.

Memory cell threshold verification (to be referred to as verify hereinafter) generally performed as an internal operation of the NAND flash memory in a write or an erase operation is none other than a read operation. Hence, not only the read characteristic but also the write and erase characteristics tend to degrade.

BRIEF DESCRIPTION OF THE DRAWINGS

FIG. 3 is a circuit diagram showing the main part of the nonvolatile semiconductor memory device according to the first embodiment;

FIG. 8 is a circuit diagram showing the main part of a nonvolatile semiconductor memory device according to the third embodiment;

FIG. 10 is a circuit diagram showing the main part of a nonvolatile semiconductor memory device according to the fourth embodiment;

FIG. 12 is a circuit diagram showing the main part of a nonvolatile semiconductor memory device according to the fifth embodiment;

FIG. 14 is a circuit diagram showing the main part of a nonvolatile semiconductor memory device according to the sixth embodiment;

FIG. 15 is a timing chart showing the operation of the nonvolatile semiconductor memory device according to the sixth embodiment;

FIG. 16 is a circuit diagram showing the main part of a nonvolatile semiconductor memory device according to the seventh embodiment;

FIG. 18 is a circuit diagram showing the main part of a nonvolatile semiconductor memory device according to the eighth embodiment;

FIG. 19 is a timing chart showing the operation of the nonvolatile semiconductor memory device according to the eighth embodiment;

DETAILED DESCRIPTION

In general, according to one embodiment, a nonvolatile semiconductor memory device includes: a memory cell transistor configured to electrically rewrite data; a word line connected to a gate of the memory cell transistor; a row decoder which applies a read voltage to the word line; a bit line connected to a drain of the memory cell transistor; a sense amplifier which determines the data in the memory cell transistor via the bit line; a first bit line clamp transistor connected in series between the bit line and the sense amplifier; a second bit line clamp transistor connected in parallel to the first bit line clamp transistor and having a current driving capability higher than that of the first bit line clamp transistor; and a bit line control circuit which turns on the first bit line clamp transistor and the second bit line clamp transistor using a common gate voltage during a predetermined period from a start of charge of the bit line, and turns off only the second bit line clamp transistor when the predetermined period has elapsed.

Comparative Example

For comparison to the embodiments, a comparative example will be described below concerning a phenomenon that the read characteristic degrades due to mutual interference between adjacent bit lines. This comparative example will be explained with reference to FIGS. 21, 22, 23, and 24.

Figure 21:
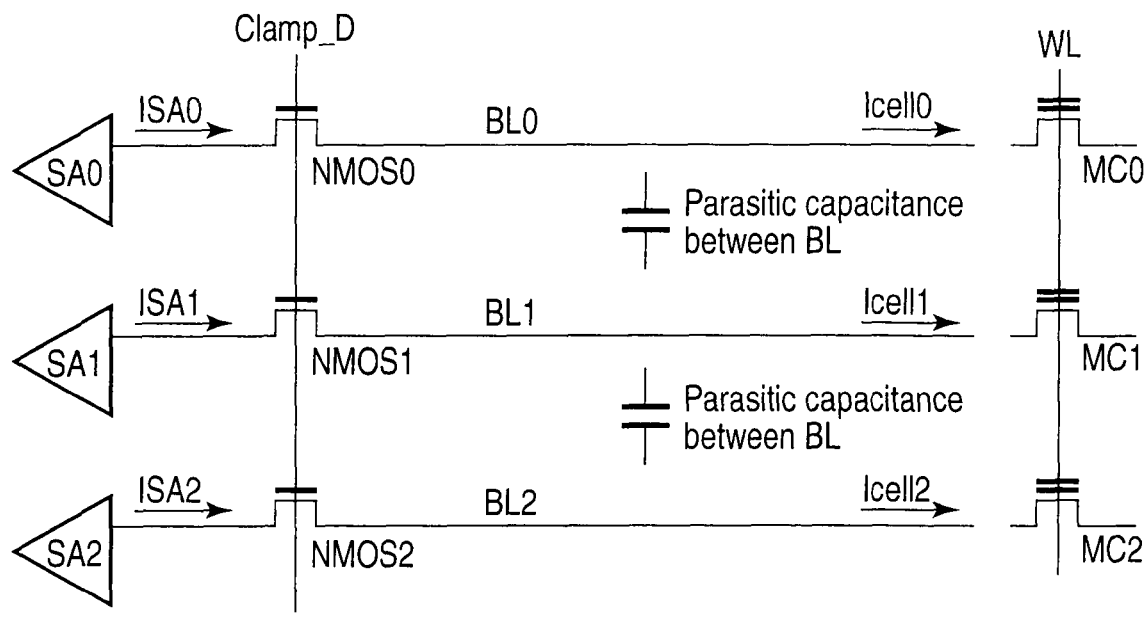
FIG. 21 is a circuit diagram showing the main part of a nonvolatile semiconductor memory device according to a comparative example.

FIG. 21 shows three bit lines BL0 to BL2 adjacent to each other, NMOS transistors NMOS0 to NMOS2 configured to clamp the potentials of the bit lines, and sense amplifiers SA0 to SA2 configured to sense the potentials of the bit lines. A gate signal Clamp_D controls the gates of the NMOS transistors NMOS0 to NMOS2. Currents flowing from the sense amplifiers SA0 to SA2 are represented by ISA0 to ISA2. Currents flowing through the memory cells are represented by Icell0 to Icell2.

Figure 22:
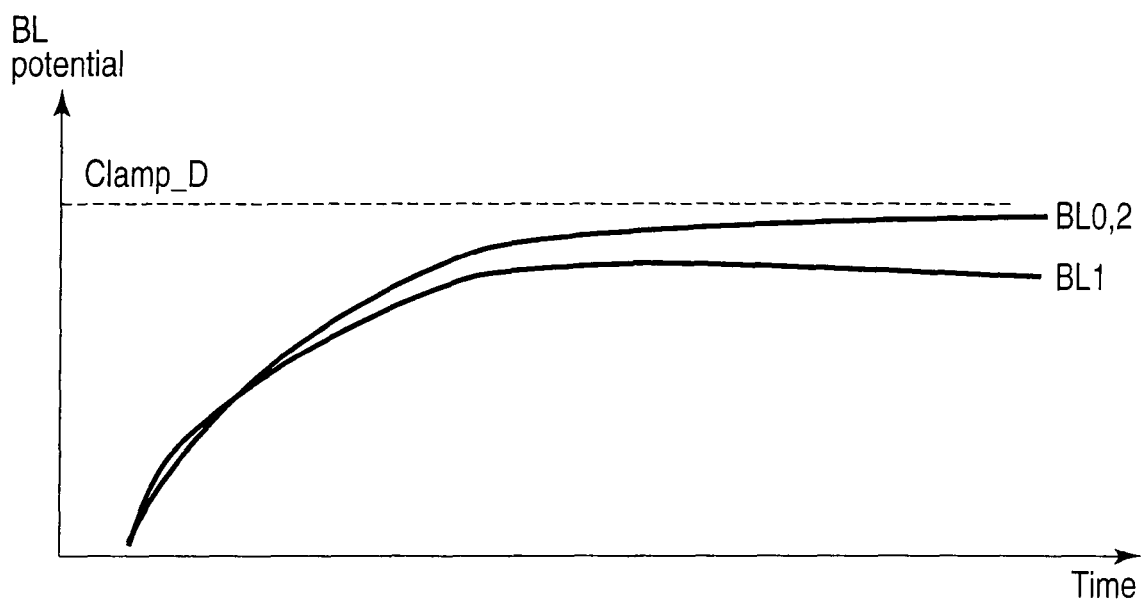
FIG. 22 is a timing chart showing changes in bit line potentials of the nonvolatile semiconductor memory device according to the comparative example.
Figure 23:
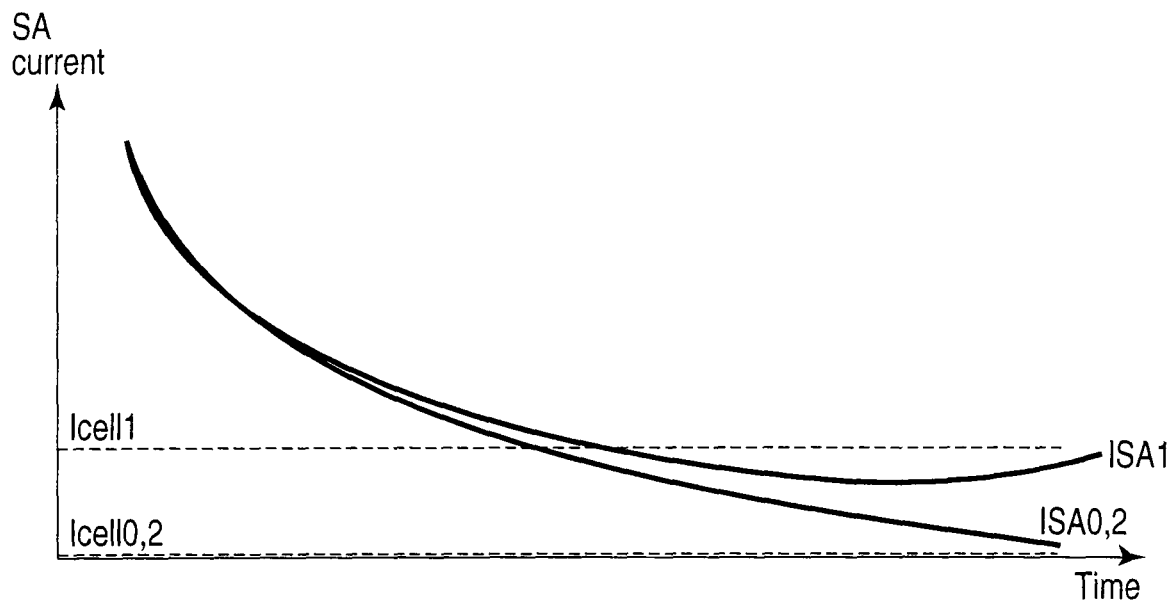
FIG. 23 is a timing chart showing changes in sense amplifier currents of the nonvolatile semiconductor memory device according to the comparative example.

In this comparative example, a case will be described in which a memory cell MC1 connected to the bit line BL1 is turned on, and memory cells MC0 and MC2 connected to the bit lines BL0 and BL2 are turned off in a read operation. FIGS. 22 and 23 show changes in bit line potentials and changes in currents flowing from the sense amplifiers in this read operation. FIG. 22 illustrates the relationship between the time and the bit line potential in the read operation. FIG. 23 illustrates the relationship between the time and the sense amplifier current in the read operation.

As shown in FIGS. 22 and 23, the bit lines BL0 and BL2 connected to the memory cells MC0 and MC2 in the OFF state have the highest charging operating point, and their charge time is long. The bit line BL1 connected to the memory cell MC1 in the ON state is raised to a high potential by the parasitic capacitances to the adjacent bit lines BL0 and BL2. When viewed from the sense amplifiers SA0 and SA2, the apparent memory cell currents ISA0 and ISA2 decrease.

That is, the present inventor found a phenomenon that as the memory cells become smaller, the memory cell currents in the ON state decrease, and the parasitic capacitances between the bit lines remarkably increase, and consequently, the memory cell currents viewed from the sense amplifiers are unstable in both a memory cell in the ON state and that in the OFF state before waiting for a longer time.

Figure 24:
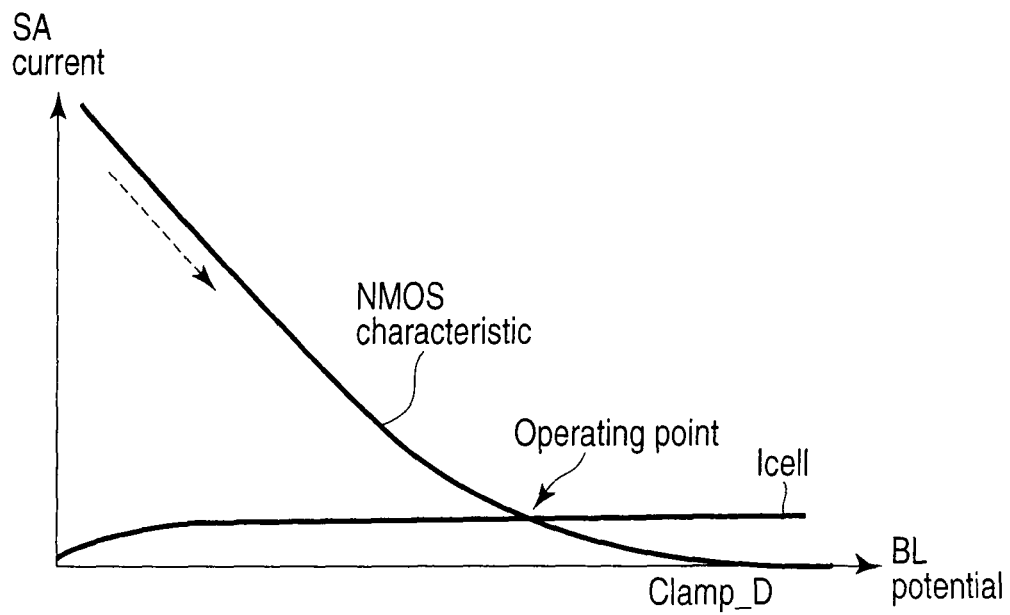
FIG. 24 is a graph showing the load characteristic of the nonvolatile semiconductor memory device according to the comparative example.

FIG. 24 is a graph for explaining the mechanism of the bit line potential change. As shown in FIG. 24, the potential of a bit line changes in accordance with the characteristic of the NMOS transistor that clamps the bit line potential, and reaches the operating point. Conversely speaking, the load characteristic of the NMOS transistor is the factor that determines the bit line charge capability.

Based on the above-described viewpoint, a plurality of embodiments will now be described with reference to the accompanying drawing. As a nonvolatile semiconductor memory device according to an embodiment, for example, a NAND flash memory will be explained.

First Embodiment

Figure 1:
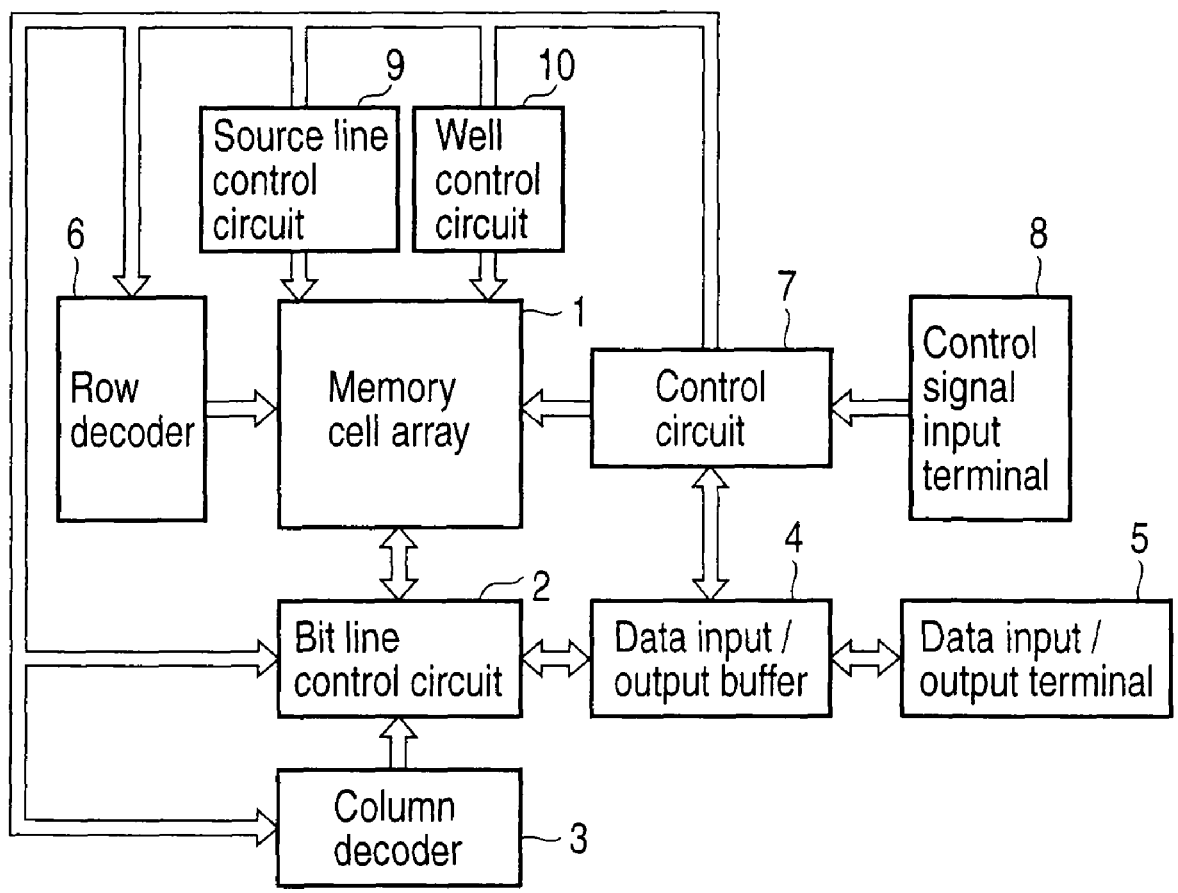
FIG. 1 is a block diagram of a nonvolatile semiconductor memory device according to the first embodiment.
Figure 2:
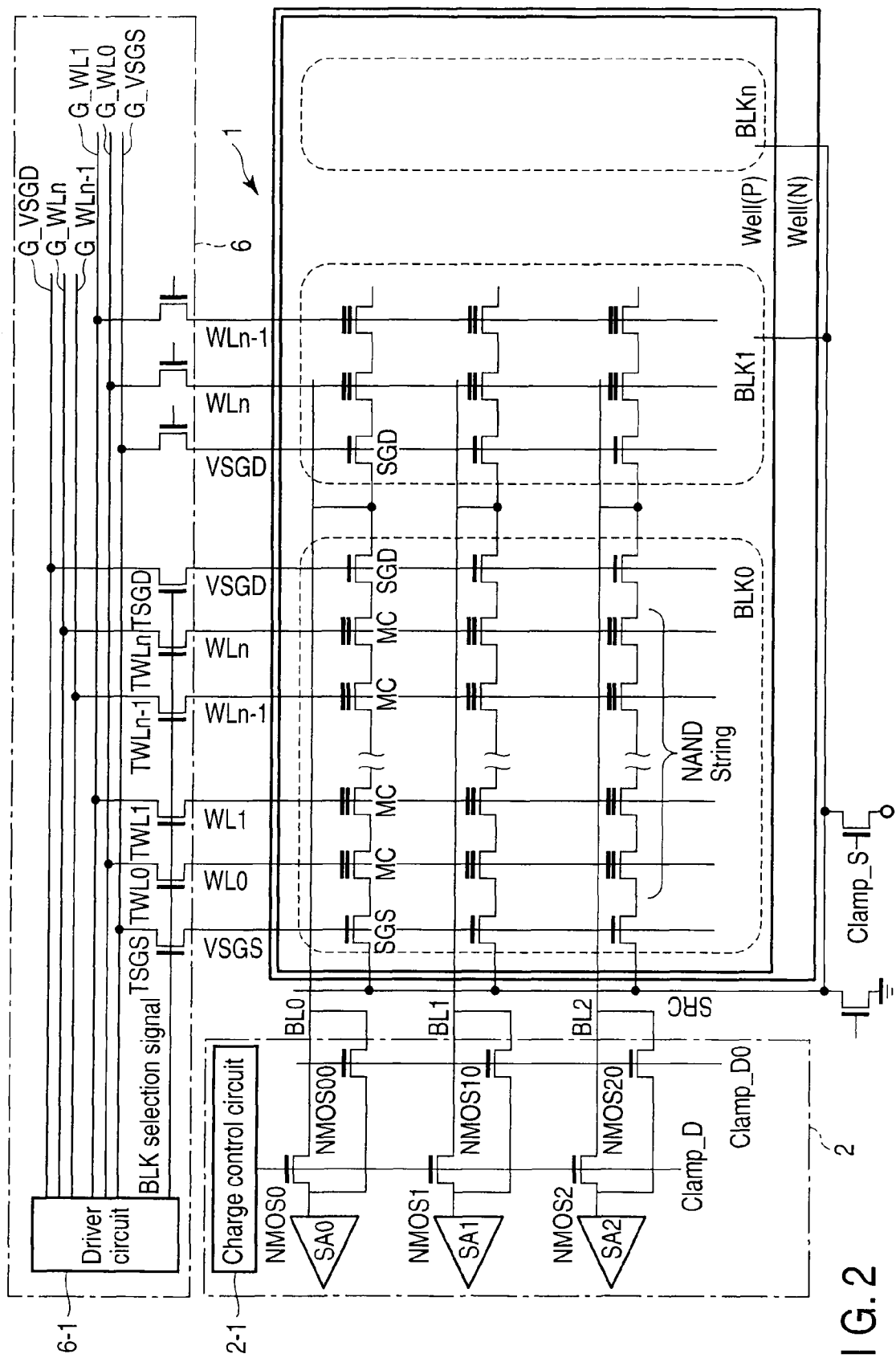
FIG. 2 is a circuit diagram showing the main part of the nonvolatile semiconductor memory device according to the first embodiment.

FIG. 1 is a block diagram showing an example of the arrangement of a NAND flash memory 100 according to the first embodiment. FIG. 2 is a circuit diagram showing the main part of the NAND flash memory 100 according to the first embodiment, including a memory cell array 1, a bit line control circuit 2, and a row decoder 6 shown in FIG. 1.

As shown in FIG. 1, the NAND flash memory 100 comprises the memory cell array 1, the bit line control circuit 2, a column decoder 3, a data input/output buffer 4, a data input/output terminal 5, the row decoder 6, a control circuit 7, a control signal input terminal 8, a source line control circuit 9, and a well control circuit 10.

The memory cell array 1 includes a plurality of bit lines BL, a plurality of word lines WL, and a source line SRC. The memory cell array 1 is formed from a plurality of blocks BLK in which electrically rewritable memory cells MC are arranged in a matrix. Each memory cell MC has, for example, a layered structure including a control gate electrode and a floating gate electrode, and stores binary or multi-level data in accordance with a change in the threshold of a transistor determined by the amount of charges injected into the floating gate electrode. The memory cell MC may have a MONOS (Metal-Oxide-Nitride-Oxide-Silicon) structure in which a nitride film traps electrons.

The bit line control circuit 2 configured to control the voltages of the bit lines BL and the row decoder 6 configured to control the voltages of the word lines WL are connected to the memory cell array 1. In a data erase operation, the row decoder 6 selects a block BLK so the remaining blocks BLK remain unselected.

The bit line control circuit 2 includes sense amplifiers SA configured to sense and amplify the voltages of the bit lines BL in the memory cell array 1, data storage circuits (not shown) each also serving as a data latch circuit configured to latch data to be written, and a charge control circuit 2-1 configured to control clamp NMOS transistors to be described later.

The bit line control circuit 2 reads out data from the memory cells MC in the memory cell array 1 via the bit lines BL, detects the states of the memory cells MC via the bit lines BL, or applies write control voltages to the memory cells MC via the bit lines BL to write data in the memory cells MC.

The column decoder 3 and the data input/output buffer 4 are connected to the bit line control circuit 2. The column decoder 3 selects a data storage circuit in the bit line control circuit 2. Data of the memory cell MC read out to the data storage circuit is output from the data input/output terminal 5 to the outside via the data input/output buffer 4.

Write data externally input to the data input/output terminal 5 is stored, via the data input/output buffer 4, in a data storage circuit selected by the column decoder 3. Not only write data but also addresses and various kinds of commands for write, read, erase, status read, and the like are input from the data input/output terminal 5.

The row decoder 6 is connected to the memory cell array 1. The row decoder 6 applies voltages necessary for a read operation, write operation, or erase operation to the word lines WL and select gate lines VSGS and VSGD in the memory cell array 1. The row decoder 6 includes a driver control circuit 6-1 connected to a plurality of control lines to be described later to selectively apply the voltages to the word lines WL and the select gate lines VSGS and VSGD.

The source line control circuit 9 is connected to the memory cell array 1. The source line control circuit 9 controls the voltage of the source line SRC.

The well control circuit 10 is connected to the memory cell array 1. The well control circuit 10 controls the voltage of the semiconductor substrate (well) in which the memory cells MC are formed. In this embodiment, the memory cell array 1 adopts a double well structure so that an N well (Well(N)) is formed on a semiconductor substrate, and the plurality of blocks BLK are arranged in a P well (Well(P)) formed on the N well.

The control circuit 7 controls the memory cell array 1, bit line control circuit 2, column decoder 3, data input/output buffer 4, row decoder 6, source line control circuit 9, and well control circuit 10. The control circuit 7 includes a boosting circuit (not shown) that boosts the power supply voltage. The control circuit 7 causes the boosting circuit to boost the power supply voltage as needed, and supplies it to the bit line control circuit 2, column decoder 3, data input/output buffer 4, row decoder 6, source line control circuit 9, and well control circuit 10.

The control circuit 7 performs the control operation in accordance with control signals (e.g., command latch enable signal CLE, address latch enable signal ALE, and ready/busy signal RY/BY) externally input via the control signal input terminal 8 and commands input from the data input/output terminal 5 via the data input/output buffer 4. That is, when programming, verifying, reading, or erasing data, the control circuit 7 generates desired voltages and supplies them to the units of the memory cell array 1 in accordance with the control signals and commands.

As shown in FIG. 2, the memory cell array 1 has blocks BLK0, BLK1, . . . , BLKn formed by parallelly arranging NAND strings each including a plurality of memory cells MC connected in series. Each NAND string is formed from n (for example, 64) memory cells MC connected in series. A drain-side select MOS transistor SGD is connected to one end of each NAND string, and a source-side select MOS transistor SGS is connected to the other end. The source-side select MOS transistor SGS is connected to the source line SRC.

The control gate electrodes of the memory cells MC arranged in each row are connected to word lines WL0 to WLn, respectively. Note that FIG. 2 shows only the word lines WL0, WL1, WLn−1, and WLn but not the word lines arranged between them for the sake of simplicity. The plurality of word lines will simply be referred to as word lines WL in some cases if they need not particularly be distinguished. The gates of the drain-side select MOS transistors SGD are connected to the drain-side select gate line VSGD. The gates of the source-side select MOS transistors SGS are connected to the source-side select gate line VSGS.

The row decoder 6 includes the driver control circuit 6-1, a plurality of transfer NMOS transistors TSGS, TSGD, and TWL0 to TWLn corresponding to each block BLK, and control lines G_VSGS, G_VSGD, G_WL0, G_WL1, . . . , G_WLn−1, and G_WLn. The drains of the transfer NMOS transistors TSGS and TSGD are connected to the source-side select MOS transistor SGS and the drain-side select MOS transistor SGD, respectively. The drains of the transfer NMOS transistors TWL0 to TWLn are connected to the word lines WL0 to WLn connected to the control gates of the memory cells MC, respectively.

The sources of the transfer NMOS transistors TSGS, TSGD, and TWL0 to TWLn are connected to the control lines G_VSGS, G_VSGD, G_WL0, G_WL1, . . . , G_WLn−1, and G_WLn connected to the driver control circuit 6-1, respectively. A block selection signal corresponding to an external address is input to the gates of the transfer NMOS transistors TSGS, TSGD, and TWL0 to TWLn. The driver control circuit 6-1 controls the gate voltages and source voltages of the transfer NMOS transistors TSGS, TSGD, and TWL0 to TWLn in accordance with the output from the control circuit 7.

That is, the row decoder 6 causes the driver control circuit 6-1 to control the gate voltages and source voltages of the transfer NMOS transistors so as to select an arbitrary block BLK in the memory cell array 1 and execute a write or read operation for the selected block BLK.

On the other hand, bit lines BL0, BL1, and BL2 are arranged to intersect the word lines WL0 to WLn and the source line SRC at right angles. FIG. 2 specifically illustrates only the three bit lines BL0, BL1, and BL2. However, the number of bit lines is not limited to this. An arbitrary number of bit lines can exist in total, and for example, 2,048 bit lines may be arranged in parallel per block BLK.

Sense amplifiers SA0, SA1, and SA2 in the bit line control circuit 2 are connected to the bit lines BL0, BL1, and BL2 via clamp NMOS transistors, respectively. A sense amplifier SA senses or controls the potential of a connected bit line BL. The internal arrangement of the bit line control circuit 2 that is the main part of the embodiment will be described below in detail with reference to FIG. 3.

FIG. 3 shows the bit line control circuit 2 and the selected word line WL according to the embodiment. The bit line control circuit 2 includes the charge control circuit 2-1, clamp transistors NMOS0, NMOS1, NMOS2, NMOS00, NMOS10, NMOS20 that clamp bit lines, and the sense amplifiers SA0, SA1, and SA2.

The clamp transistor NMOS0 is connected in series between the bit line BL0 and the sense amplifier SA0. That is, one terminal of the clamp transistor NMOS0 is connected to the bit line BL0, and the other terminal is connected to the sense amplifier SA0. The clamp transistor NMOS1 is connected in series between the bit line BL1 and the sense amplifier SA1. That is, one terminal of the clamp transistor NMOS1 is connected to the bit line BL1, and the other terminal is connected to the sense amplifier SA1. The clamp transistor NMOS2 is connected in series between the bit line BL2 and the sense amplifier SA2. That is, one terminal of the clamp transistor NMOS2 is connected to the bit line BL2, and the other terminal is connected to the sense amplifier SA2.

The clamp transistor NMOS00 is connected in parallel to the clamp transistor NMOS0. That is, one terminal of the clamp transistor NMOS00 is connected to one terminal of the clamp transistor NMOS0 and the bit line BL0, and the other terminal is connected to the other terminal of the clamp transistor NMOS0 and the sense amplifier SA0.

The clamp transistor NMOS10 is connected in parallel to the clamp transistor NMOS1. That is, one terminal of the clamp transistor NMOS10 is connected to one terminal of the clamp transistor NMOS1 and the bit line BL1, and the other terminal is connected to the other terminal of the clamp transistor NMOS1 and the sense amplifier SA1.

The clamp transistor NMOS20 is connected in parallel to the clamp transistor NMOS2. That is, one terminal of the clamp transistor NMOS20 is connected to one terminal of the clamp transistor NMOS2 and the bit line BL2, and the other terminal is connected to the other terminal of the clamp transistor NMOS2 and the sense amplifier SA2.

A gate signal Clamp_D controls the gates of the clamp transistors NMOS0, NMOS1, and NMOS2. A gate signal Clamp_D0 controls the gates of the clamp transistors NMOS00, NMOS10, and NMOS20. The charge control circuit 2-1 controls the gate signals Clamp_D and Clamp_D0 so as to on/off-control the clamp transistors at timings corresponding to control waveforms to be described later with reference to FIG. 4. The current driving capability of the clamp transistors NMOS00, NMOS10, and NMOS20 is assumed to be higher than that of the clamp transistors NMOS0, NMOS1, and NMOS2.

Figure 4:
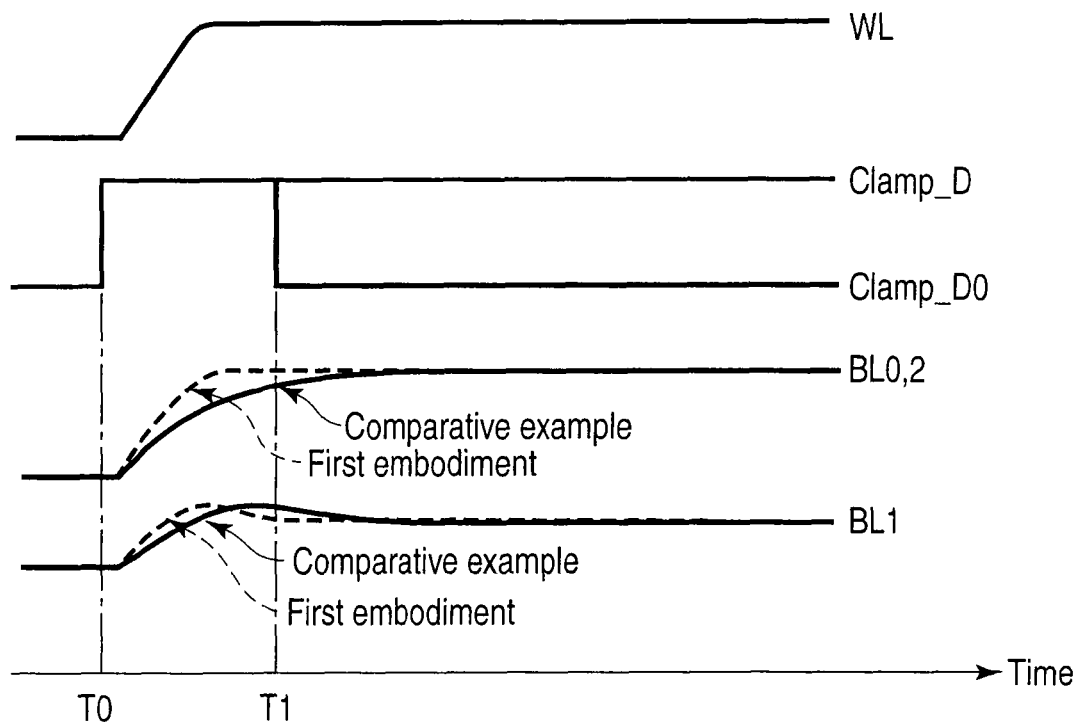
FIG. 4 is a timing chart showing the operation of the nonvolatile semiconductor memory device according to the first embodiment.

FIG. 4 shows control waveforms in the data read operation of the NAND flash memory according to the embodiment. As in the comparative example, assume that memory cells MC0 and MC2 are turned off, and a memory cell MC1 is turned on. In the read operation, when the row decoder 6 starts applying a predetermined read voltage to the selected word line WL, the bit line control circuit 2 simultaneously raises the gate signals Clamp_D and Clamp_D0 to turn on the clamp transistors NMOS0, NMOS1, NMOS2, NMOS00, NMOS10, and NMOS20 (time T0). Charge of the bit lines BL0 to BL2 thus starts.

After the elapse of a predetermined period from the time T0, the bit line control circuit 2 lowers only the gate signal Clamp_D0 to turn off the clamp transistors NMOS00, NMOS10, and NMOS20 (time T1). FIG. 4 shows changes in the potentials of the bit lines BL0 to BL2 under this control. As is apparent from FIG. 4, according to the arrangement of this embodiment, the bit lines BL can be charged quickly and stably, unlike the comparative example.

Figure 5:
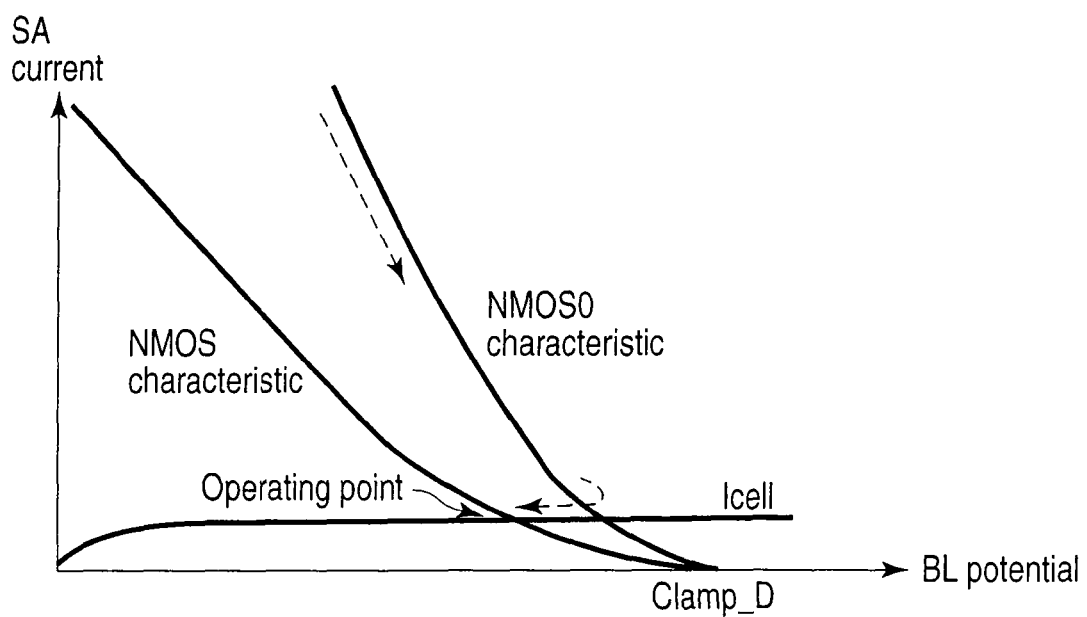
FIG. 5 is a graph showing the load characteristic of the nonvolatile semiconductor memory device according to the first embodiment.

FIG. 5 is a graph for explaining the mechanism of the bit line potential change according to the embodiment. As shown in FIG. 5, at the start of bit line charge, the NMOS load characteristic is raised by the clamp transistors NMOS00, NMOS10, and NMOS20 connected in parallel to quickly charge the bit lines. Then, the clamp transistors NMOS00, NMOS10, and NMOS20 are turned off halfway so that the clamp transistors NMOS0, NMOS1, and NMOS2 determine the final operating point.

Note that in this embodiment, the gate signal Clamp_D0 that operates the clamp transistors NMOS00, NMOS10, and NMOS20 is set to be equipotential to the gate signal Clamp_D that operates the clamp transistors NMOS0, NMOS1, and NMOS2, thereby suppressing overcharge of the bit lines BL.

As described above, according to the NAND flash memory 100 of this embodiment, it is possible to charge the bit line BL connected to the memory cell MC in the OFF state in a shorter time and thus charge and stabilize the bit line BL arranged adjacent to that bit line and connected to the memory cell MC in the ON state in a shorter time.

Second Embodiment

In this embodiment, a case will be described in which the operation timing of clamp transistors NMOS00, NMOS10, and NMOS20 is controlled more specifically under the same arrangement as in the first embodiment. In the second embodiment, a memory cell MC is assumed to be able to store multi-level data of 2 bits or more. The memory cell MC capable of multi-level storage will be referred to as a multi-level memory cell MC hereinafter.

Figure 6:
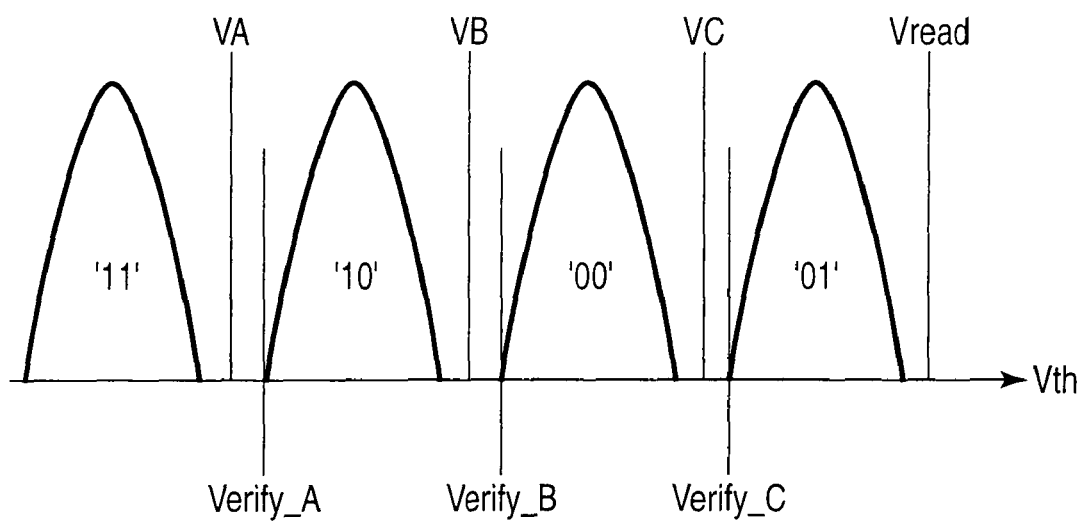
FIG. 6 is a graph showing the threshold distribution of a memory cell of a nonvolatile semiconductor memory device according to the second embodiment.

FIG. 6 shows the threshold distribution of the multi-level memory cell MC. FIG. 6 shows the multi-level memory cell MC that stores 2-bit data. However, the embodiment is not limited to this, and is also applicable to holding data of 3 bits or more. The multi-level memory cell MC holds one of data "11", "10", "00", and "01" in the order of threshold voltage (Vth).

Referring to FIG. 6, VA, VB, and VC are read voltages to be applied to a selected word line in a read operation to discriminate data held in the multi-level memory cell MC. Vread is a read voltage to be applied to render the multi-level memory cell MC connected to an unselected word line conductive independently of held data. For example, when reading out an upper page of the multi-level memory cell MC in data allocation as shown in FIG. 6, the data can be discriminated by performing the read operation using the read voltages VA and VC. In a write operation as well, to check whether data has been written in the multi-level memory cell MC up to a desired threshold voltage, a read operation is executed by applying verify voltages verify_A, verify_B, and verify_C to the selected word line (verify read).

Figure 7:
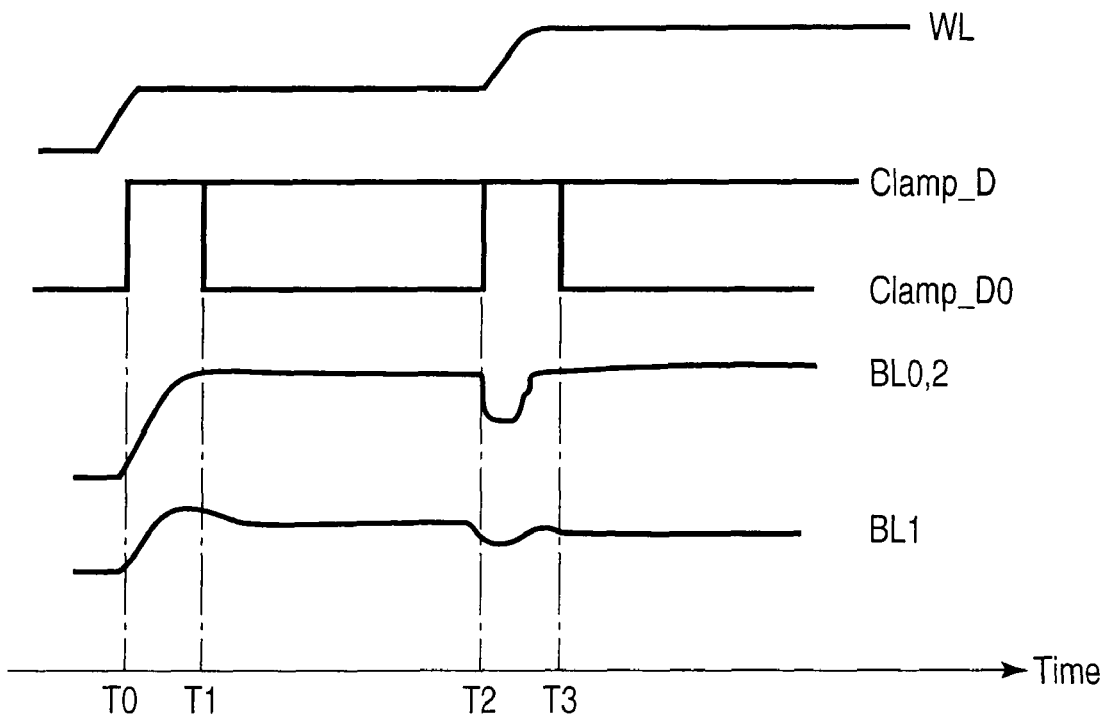
FIG. 7 is a timing chart showing the operation of the nonvolatile semiconductor memory device according to the second embodiment.

When reading out data held in the multi-level memory cell MC, the efficiency can be increased by read-accessing the same memory cell MC continuously a plurality of number of times while changing the potential applied to the word line WL. FIG. 7 shows control waveforms when read-accessing the same memory cell MC continuously a plurality of number of times while changing the potential applied to the word line WL.

As shown in FIG. 7, when the potential of the word line WL switches, a memory cell current Icell may change depending on data held in a selected memory cell MC1. That is, when the potential of the selected word line WL switches, the potential of a bit line BL1 may change. If the potential of the bit line BL1 changes, the potential of bit lines BL0 and BL2 changes due to the influence of the parasitic capacitance between the adjacent bit lines. Hence, the bit lines BL0 and BL2 need to be recharged. In this recharge as well, the phenomenon occurs, that before the bit lines BL0 and BL2 connected to memory cells MC0 and MC2 in the OFF state have been charged, the adjacent bit line BL1 of the memory cell MC in the ON state is unstable.

To prevent this, in the read operation, when the potential of the word line WL switches, a bit line control circuit 2 simultaneously raises gate signals Clamp_D and Clamp_D0 to turn on clamp transistors NMOS0, NMOS1, NMOS2, NMOS00, NMOS10, and NMOS20 (time T2). Recharge of the bit lines BL0 and BL2 thus starts. After the elapse of a predetermined period from the time T2, the bit line control circuit 2 lowers only the gate signal Clamp_D0 to turn off the clamp transistors NMOS00, NMOS10, and NMOS20 (time T3).

As described above, according to a NAND flash memory 100 of this embodiment, in addition to the operation timing of the first embodiment, even at the timing the potential of the word line WL switches, the gate signal Clamp_D0 is raised again to operate the clamp transistors NMOS00, NMOS10, and NMOS20 to quickly recharge the bit lines. This makes it possible to recharge a bit line BL connected to the memory cell MC in the OFF state in a shorter time and thus charge and stabilize the bit line BL arranged adjacent to that bit line and connected to the memory cell MC in the ON state in a shorter time.

Third Embodiment

When read-accessing the same memory cell MC continuously a plurality of number of times while changing the potential applied to a word line WL, as in the second embodiment, a first read voltage (for example, verify voltage verify_A) is applied to the word line to read-access (verify) the memory cell MC. Then, the verified memory cell MC in the ON state is read-accessed again by applying, to the word line, a second read voltage (verify voltage verify_B) higher than the first read voltage. In this case, the current continuously flows, resulting in an increase in current consumption.

In the third embodiment, as shown in FIG. 8, switches are provided at the input of each sense amplifier SA not to charge a bit line BL connected to an already read-accessed memory cell MC in the ON state in accordance with read data when a higher word line potential is applied (to be referred to as a lock-out scheme hereinafter). FIG. 8 illustrates a bit line control circuit 2 that adopts the lock-out scheme. The components other than the bit line control circuit 2 are almost the same as in FIG. 2, and a description thereof will not be repeated.

The bit line control circuit 2 includes a charge control circuit 2-1, clamp transistors NMOS0, NMOS1, NMOS2, NMOS00, NMOS10, and NMOS20, sense amplifiers SA0, SA1, and SA2, and switches SW0, /SW0, SW1, /SW1, SW2, and /SW2. The charge control circuit 2-1 and the clamp transistors NMOS0, NMOS1, NMOS2, NMOS00, NMOS10, and NMOS20 are the same as in the first and second embodiments, and a description thereof will not be repeated. The symbol "/" indicates input of an inverted signal.

The other terminal of the clamp transistor NMOS0 and the other terminal of the clamp transistor NMOS00 are connected to the sense amplifier SA0 via the switch SW0. The other terminal of the clamp transistor NMOS0 and the other terminal of the clamp transistor NMOS00 are also connected to an RST potential via the switch /SW0. The switches SW0 and /SW0 are on/off-controlled based on data 0 that is a result of determination of the potential of a bit line BL0 by the sense amplifier SA0.

The other terminal of the clamp transistor NMOS1 and the other terminal of the clamp transistor NMOS10 are connected to the sense amplifier SA1 via the switch SW1. The other terminal of the clamp transistor NMOS1 and the other terminal of the clamp transistor NMOS10 are also connected to an RST potential via the switch /SW1. The switches SW1 and /SW1 are on/off-controlled based on data 1 that is a result of determination of the potential of a bit line BL1 by the sense amplifier SA1.

The other terminal of the clamp transistor NMOS2 and the other terminal of the clamp transistor NMOS20 are connected to the sense amplifier SA2 via the switch SW2. The other terminal of the clamp transistor NMOS2 and the other terminal of the clamp transistor NMOS20 are also connected to an RST potential via the switch /SW2. The switches SW2 and /SW2 are on/off-controlled based on data 2 that is a result of determination of the potential of a bit line BL2 by the sense amplifier SA2.

According to the above-described arrangement, control can be done not to charge the bit line BL connected to the already read-accessed memory cell MC in the ON state when the next higher word line potential is applied. On the other hand, performing read a plurality of number of times (for example, twice) at the same word line potential using the function allows to improve the reliability of data determination. This will be explained with reference to FIG. 9.

Figure 9:
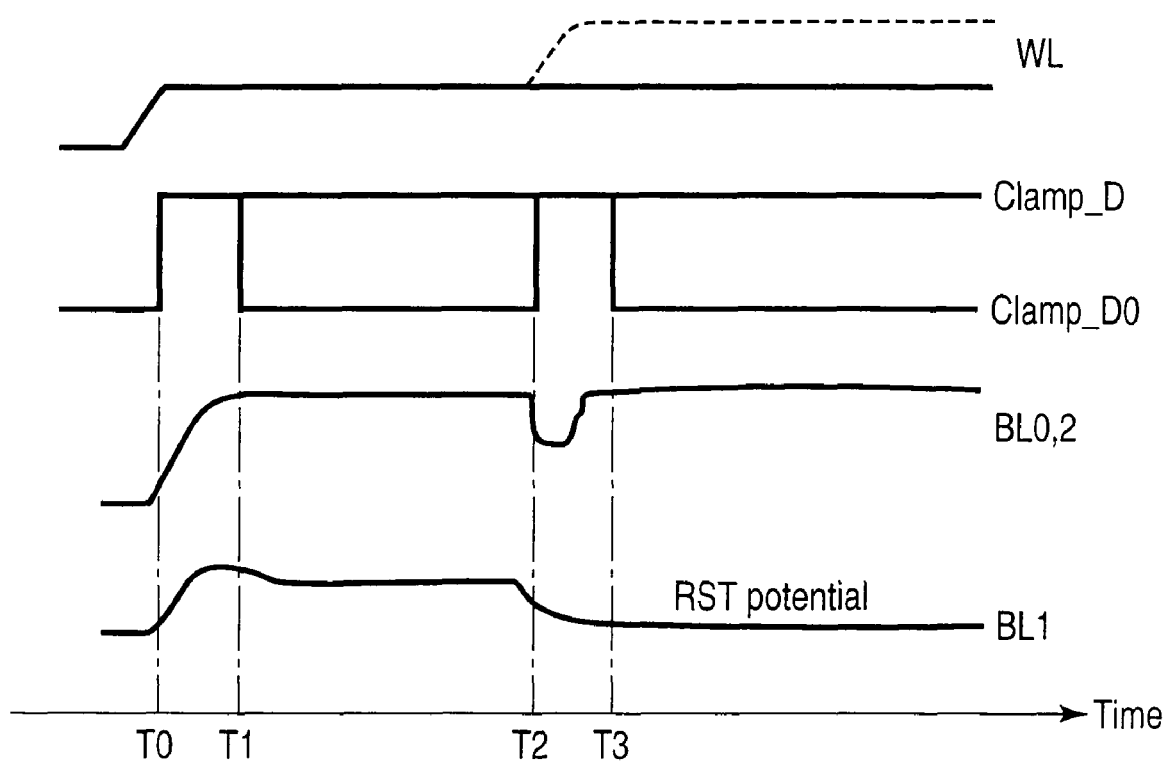
FIG. 9 is a timing chart showing the operation of the nonvolatile semiconductor memory device according to the third embodiment.

FIG. 9 shows control waveforms when executing read a plurality of number of times at the same word line potential using the lock-out operation. As shown in FIG. 9, when performing read at the same word line potential as well, in some cases, after data held in the memory cell MC in the ON state with a large memory cell current Icell is confirmed in the first read, lock-out is performed, and data held in the memory cell MC in the ON state with the small memory cell current Icell is confirmed in the second read. The lock-out operation makes the potential of the bit line BL1 connected to a memory cell MC1 in the ON state transit to the RST potential (for example, ground potential). Hence, the adjacent bit lines BL0 and BL2 connected to memory cells MC0 and MC2 in the OFF state change their potential, and therefore need to be recharged.

Even when the potential of a word line WL does not switch in the read operation, the bit line control circuit 2 raises gate signals Clamp_D and Clamp_D0 at the timing of lock-out operation to turn on the clamp transistors NMOS0, NMOS1, NMOS2, NMOS00, NMOS10, and NMOS20 (time T2). Recharge of the bit lines BL0 and BL2 thus starts. After the elapse of a predetermined period from the time T2, the bit line control circuit 2 lowers only the gate signal Clamp_D0 to turn off the clamp transistors NMOS00, NMOS10, and NMOS20 (time T3).

As described above, according to a NAND flash memory 100 of this embodiment, even when the potential of the word line WL does not switch in the read operation, the gate signal Clamp_D0 is raised again at the timing of lock-out operation to operate the clamp transistors NMOS00, NMOS10, and NMOS20 to quickly recharge the bit lines. This makes it possible to recharge the bit line BL connected to the memory cell MC in the OFF state in a shorter time and thus charge and stabilize the bit line BL arranged adjacent to that bit line and connected to the memory cell MC in the ON state in a shorter time.

Fourth Embodiment

When read-accessing the same memory cell MC continuously a plurality of number of times while changing the potential applied to a word line WL, as in the second embodiment, the potential of a bit line BL changes or not depending on the read voltage applied to the word line WL next. When the potential changes, the change amount may be different due to the variation in the threshold voltage of the memory cell MC connected to the bit line BL. If various combinations of bit line potentials are available, an attempt to uniformly control them may make settings difficult.

As a characteristic feature of this embodiment, reset transistors to initialize (discharge) bit line potentials are provided, as shown in FIG. 10. FIG. 10 illustrates a bit line control circuit 2 according to this embodiment. The bit line control circuit 2 includes a charge control circuit 2-1, clamp transistors NMOS0, NMOS1, and NMOS2, reset transistors NMOS01, NMOS11, and NMOS21, and sense amplifiers SA0, SA1, and SA2.

One terminal of the clamp transistor NMOS0 is connected to a bit line BL0, and the other terminal is connected to the sense amplifier SA0. One terminal of the reset transistor NMOS01 is connected to the bit line BL0 and one terminal of the clamp transistor NMOS0, and the other terminal is connected to a reset potential.

One terminal of the clamp transistor NMOS1 is connected to a bit line BL1, and the other terminal is connected to the sense amplifier SA1. One terminal of the reset transistor NMOS11 is connected to the bit line BL1 and one terminal of the clamp transistor NMOS1, and the other terminal is connected to a reset potential.

One terminal of the clamp transistor NMOS2 is connected to a bit line BL2, and the other terminal is connected to the sense amplifier SA2. One terminal of the reset transistor NMOS21 is connected to the bit line BL2 and one terminal of the clamp transistor NMOS2, and the other terminal is connected to a reset potential.

A gate signal Clamp_D controls the gates of the clamp transistors NMOS0, NMOS1, and NMOS2. A gate signal RST controls the gates of the reset transistors NMOS01, NMOS11, and NMOS21. The charge control circuit 2-1 controls raising/lowering of the gate signals Clamp_D and RST so as to charge the bit lines BL0 to BL2.

Figure 11:
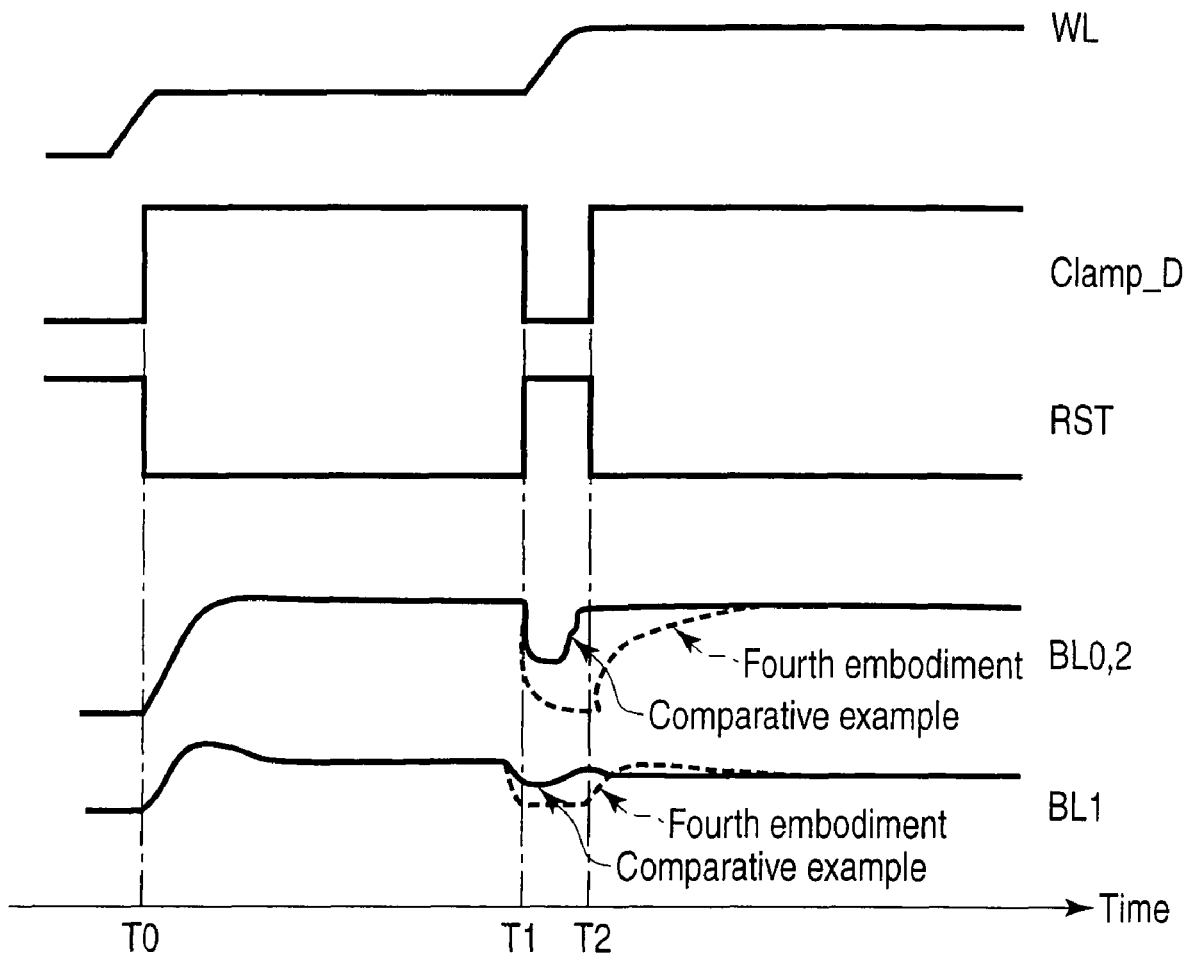
FIG. 11 is a timing chart showing the operation of the nonvolatile semiconductor memory device according to the fourth embodiment.

FIG. 11 shows control waveforms when the bit line control circuit 2 according to the embodiment initializes the bit line potentials at a timing the word line potential switches. Assume that memory cells MC0 and MC2 are turned off, and a memory cell MC1 is turned on.

In the read operation, when a row decoder 6 starts applying a predetermined read voltage to the selected word line WL, the bit line control circuit 2 simultaneously raises the gate signal Clamp_D to turn on the clamp transistors NMOS0, NMOS1, and NMOS2, and lowers the gate signal RST to turn off the reset transistors NMOS01, NMOS11, and NMOS21. Charge of the bit lines BL0 to BL2 thus starts (time T0).

Next, upon switching the potential of the word line WL, the bit line control circuit 2 lowers the gate signal Clamp_D to turn off the clamp transistors NMOS0, NMOS1, and NMOS2, and raises the gate signal RST to turn on the reset transistors NMOS01, NMOS11, and NMOS21. The potentials of the bit lines BL0 to BL2 are thus initialized (time T1).

After the elapse of a predetermined period from the time T1, the bit line control circuit 2 raises the gate signal Clamp_D to turn on the clamp transistors NMOS0, NMOS1, and NMOS2, and lowers the gate signal RST to turn off the reset transistors NMOS01, NMOS11, and NMOS21. Recharge of the bit lines BL0 to BL2 thus starts (time T2).

As described above, a reset transistor configured to discharge a bit line is arranged. This enables to initialize the bit line potential at the second or subsequent read timing at which the word line potential switches, as shown in FIG. 11, and facilitate uniform control in both a case in which the potential of the bit line BL changes depending on the read voltage applied to the word line WL and a case in which the bit line potential does not change.

Fifth Embodiment

In this embodiment, an arrangement that combines the lock-out scheme described in the third embodiment with the fourth embodiment will be described. FIG. 12 illustrates the arrangement of a bit line control circuit 2 according to the embodiment. The bit line control circuit 2 includes a charge control circuit 2-1, clamp transistors NMOS0, NMOS1, and NMOS2, reset transistors NMOS01, NMOS11, and NMOS21, switches SW0, /SW0, SW1, /SW1, SW2, and /SW2, and sense amplifiers SA0, SA1, and SA2.

One terminal of the clamp transistor NMOS0 is connected to a bit line BL0, and the other terminal is connected to the sense amplifier SA0 via the switch SW0 and also to an RST potential via the switch /SW0. One terminal of the reset transistor NMOS01 is connected to the bit line BL0 and one terminal of the clamp transistor NMOS0, and the other terminal is connected to the reset potential. The switches SW0 and /SW0 are on/off-controlled based on data 0 that is a result of determination of the potential of the bit line BL0 by the sense amplifier SA0.

One terminal of the clamp transistor NMOS1 is connected to a bit line BL1, and the other terminal is connected to the sense amplifier SA1 via the switch SW and also to an RST potential via the switch /SW1. One terminal of the reset transistor NMOS11 is connected to the bit line BL1 and one terminal of the clamp transistor NMOS1, and the other terminal is connected to the reset potential. The switches SW1 and /SW1 are on/off-controlled based on data 1 that is a result of determination of the potential of the bit line BL1 by the sense amplifier SA1.

One terminal of the clamp transistor NMOS2 is connected to a bit line BL2, and the other terminal is connected to the sense amplifier SA2 via the switch SW2 and also to an RST potential via the switch /SW2. One terminal of the reset transistor NMOS21 is connected to the bit line BL2 and one terminal of the clamp transistor NMOS2, and the other terminal is connected to the reset potential. The switches SW2 and /SW2 are on/off-controlled based on data 2 that is a result of determination of the potential of the bit line BL2 by the sense amplifier SA2.

A gate signal Clamp_D controls the gates of the clamp transistors NMOS0, NMOS1, and NMOS2. A gate signal RST controls the gates of the reset transistors NMOS01, NMOS11, and NMOS21. The charge control circuit 2-1 controls raising/lowering of the gate signals Clamp_D and RST so as to charge the bit lines BL0 to BL2.

Figure 13:
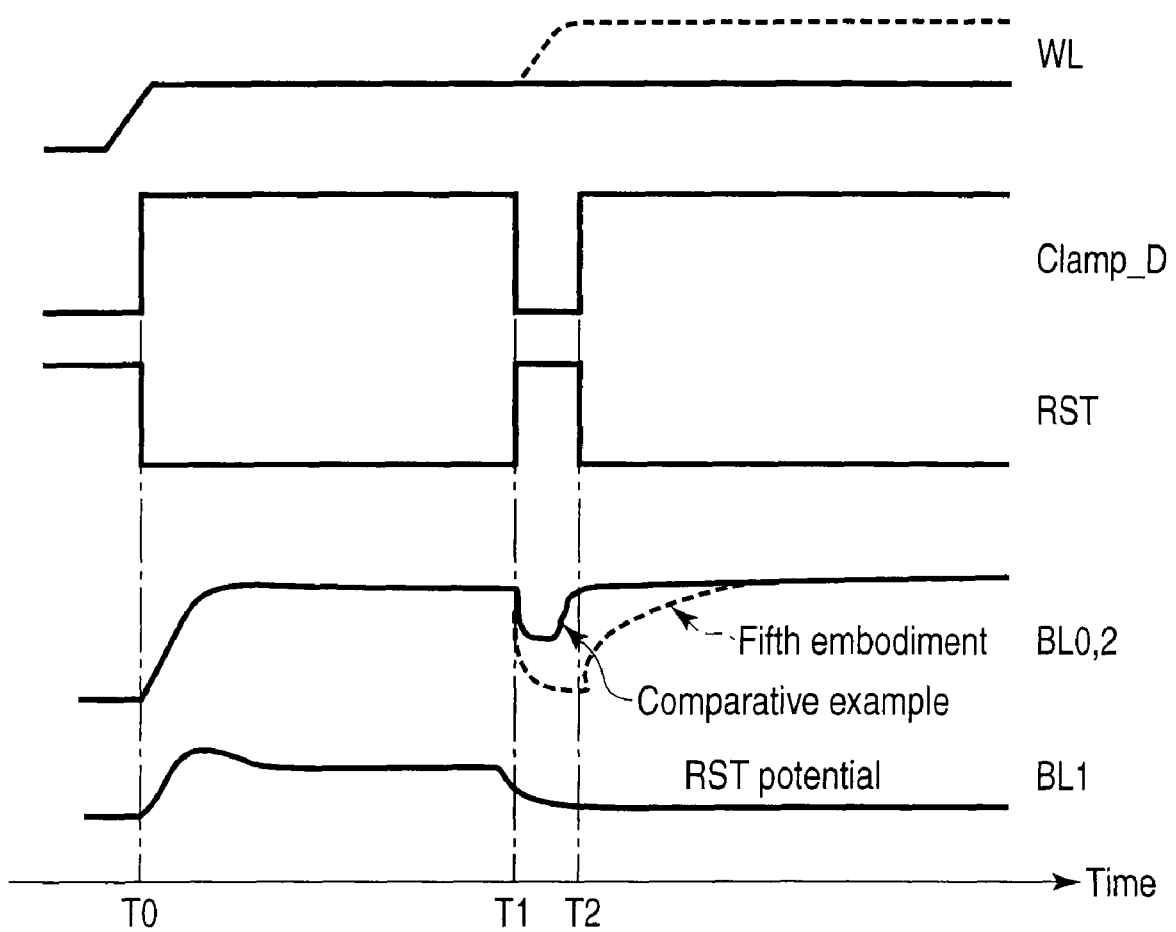
FIG. 13 is a timing chart showing the operation of the nonvolatile semiconductor memory device according to the fifth embodiment.

FIG. 13 shows control waveforms when executing read a plurality of number of times at the same word line potential using the lock-out operation. The lock-out operation makes the potential of the bit line BL1 connected to a memory cell MC1 in the ON state transit to the RST potential (for example, ground potential). The adjacent bit lines BL0 and BL2 connected to memory cells MC0 and MC2 in the OFF state change their potential, and therefore need to be recharged.

In the read operation, when a row decoder 6 starts applying a predetermined read voltage to a selected word line WL, the bit line control circuit 2 simultaneously raises the gate signal Clamp_D to turn on the clamp transistors NMOS0, NMOS1, and NMOS2, and lowers the gate signal RST to turn off the reset transistors NMOS01, NMOS11, and NMOS21. Charge of the bit lines BL0 to BL2 thus starts (time T0).

Even when the potential of the word line WL does not switch in the read operation, the bit line control circuit 2 lowers the gate signal Clamp_D at the timing of lock-out operation to turn off the clamp transistors NMOS0, NMOS1, and NMOS2, and also raises the gate signal RST to turn on the reset transistors NMOS01, NMOS11, and NMOS21. The potentials of the bit lines BL0 to BL2 are thus initialized (time T1).

After the elapse of a predetermined period from the time T1, the bit line control circuit 2 raises the gate signal Clamp_D to turn on the clamp transistors NMOS0, NMOS1, and NMOS2, and lowers the gate signal RST to turn off the reset transistors NMOS01, NMOS11, and NMOS21. Recharge of the bit lines BL0 to BL2 thus starts. FIG. 13 shows a case in which the read of the memory cell MC1 connected to the bit line BL1 ends, and recharge is prohibited by the lock-out operation (time T2).

As described above, according to this embodiment, it is possible to initialize the bit line potentials in second or subsequent read in which the lock-out operation is performed, and facilitate uniform control in both a case in which the bit line potential changes due to the lock-out operation and a case in which the bit line potential does not change.

Sixth Embodiment

In this embodiment, an arrangement that combines the bit line control circuit 2 according to the second embodiment with the reset transistors according to the fourth embodiment will be described. FIG. 14 illustrates the arrangement of a bit line control circuit 2 according to the embodiment. The bit line control circuit 2 includes a charge control circuit 2-1, clamp transistors NMOS0, NMOS1, NMOS2, NMOS00, NMOS10, and NMOS20, reset transistors NMOS01, NMOS11, and NMOS21, and sense amplifiers SA0, SA1, and SA2.

The clamp transistor NMOS0 is connected in series between a bit line BL0 and the sense amplifier SA0. That is, one terminal of the clamp transistor NMOS0 is connected to the bit line BL0, and the other terminal is connected to the sense amplifier SA0. The clamp transistor NMOS1 is connected in series between a bit line BL1 and the sense amplifier SA1. That is, one terminal of the clamp transistor NMOS1 is connected to the bit line BL1, and the other terminal is connected to the sense amplifier SA1. The clamp transistor NMOS2 is connected in series between a bit line BL2 and the sense amplifier SA2. That is, one terminal of the clamp transistor NMOS2 is connected to the bit line BL2, and the other terminal is connected to the sense amplifier SA2.

The clamp transistor NMOS00 is connected in parallel to the clamp transistor NMOS0. That is, one terminal of the clamp transistor NMOS00 is connected to one terminal of the clamp transistor NMOS0 and the bit line BL0, and the other terminal is connected to the other terminal of the clamp transistor NMOS0 and the sense amplifier SA0.

The clamp transistor NMOS10 is connected in parallel to the clamp transistor NMOS1. That is, one terminal of the clamp transistor NMOS10 is connected to one terminal of the clamp transistor NMOS1 and the bit line BL1, and the other terminal is connected to the other terminal of the clamp transistor NMOS1 and the sense amplifier SA1.

The clamp transistor NMOS20 is connected in parallel to the clamp transistor NMOS2. That is, one terminal of the clamp transistor NMOS20 is connected to one terminal of the clamp transistor NMOS2 and the bit line BL2, and the other terminal is connected to the other terminal of the clamp transistor NMOS2 and the sense amplifier SA2.

One terminal of the reset transistor NMOS01 is connected to the bit line BL0, one terminal of the clamp transistor NMOS0, and one terminal of the clamp transistor NMOS00, and the other terminal is connected to a reset potential.

One terminal of the reset transistor NMOS11 is connected to the bit line BL1, one terminal of the clamp transistor NMOS1, and one terminal of the clamp transistor NMOS10, and the other terminal is connected to a reset potential.

One terminal of the reset transistor NMOS21 is connected to the bit line BL2, one terminal of the clamp transistor NMOS2, and one terminal of the clamp transistor NMOS20, and the other terminal is connected to a reset potential.

A gate signal Clamp_D controls the gates of the clamp transistors NMOS0, NMOS1, and NMOS2. A gate signal Clamp_D0 controls the gates of the clamp transistors NMOS00, NMOS10, and NMOS20. A gate signal RST controls the gates of the reset transistors NMOS01, NMOS11, and NMOS21. The charge control circuit 2-1 controls the gate signals Clamp_D, Clamp_D0, and RST so as to on/off-control the transistors at timings corresponding to control waveforms to be described later with reference to FIG. 15.

FIG. 15 shows control waveforms when the bit line control circuit 2 read-accesses the same memory cell MC continuously a plurality of number of times while changing the potential applied to a word line WL. Assume that memory cells MC0 and MC2 are turned off, and a memory cell MC1 is turned on.

In the read operation, when a row decoder 6 starts applying a predetermined read voltage to the selected word line WL, the bit line control circuit 2 simultaneously raises the gate signals Clamp_D and Clamp_D0 to turn on the clamp transistors NMOS0, NMOS1, NMOS2, NMOS00, NMOS10, and NMOS20, and lowers the gate signal RST to turn off the reset transistors NMOS01, NMOS11, and NMOS21. Charge of the bit lines BL0 to BL2 thus starts (time T0).

After the elapse of a predetermined period from the time T0, the bit line control circuit 2 lowers only the gate signal Clamp_D0 to turn off the clamp transistors NMOS00, NMOS10, and NMOS20 (time T1). After that, the bit line control circuit 2 confirms the data determination result of a sense amplifier SA in the first read operation.

Next, upon switching the potential of the word line WL, the bit line control circuit 2 lowers the gate signal Clamp_D to turn off the clamp transistors NMOS0, NMOS1, and NMOS2, and raises the gate signal RST to turn on the reset transistors NMOS01, NMOS11, and NMOS21. The potentials of the bit lines BL0 to BL2 are thus initialized (time T2).

After the elapse of a predetermined period from the time T2, the bit line control circuit 2 raises the gate signals Clamp_D and Clamp_D0 to turn on the clamp transistors NMOS0, NMOS1, NMOS2, NMOS00, NMOS10, and NMOS20, and lowers the gate signal RST to turn off the reset transistors NMOS01, NMOS11, and NMOS21. Recharge of the bit lines BL0 to BL2 thus starts (time T3).

After the elapse of a predetermined period from the time T3, the bit line control circuit 2 lowers only the gate signal Clamp_D0 to turn off the clamp transistors NMOS00, NMOS10, and NMOS20 (time T4). After that, the bit line control circuit 2 confirms the data determination result of the sense amplifier SA in the second read operation.

As described above, according to the bit line control circuit 2 of this embodiment, even at the timing the potential of the word line WL switches, the gate signal Clamp_D0 is raised again to operate the clamp transistors NMOS00, NMOS10, and NMOS20 to quickly recharge the bit lines. This makes it possible to recharge a bit line BL connected to a memory cell MC in the OFF state in a shorter time and thus charge and stabilize the bit line BL arranged adjacent to that bit line and connected to the memory cell MC in the ON state in a shorter time.

In addition, according to the bit line control circuit 2 of this embodiment, a reset transistor configured to discharge a bit line is arranged. This enables to initialize the bit line potential at the second or subsequent read timing at which the word line potential switches, as shown in FIG. 15, and facilitate uniform control in both a case in which the potential of the bit line BL changes depending on the read voltage applied to the word line WL and a case in which the bit line potential does not change.

Seventh Embodiment

In this embodiment, an arrangement that combines the bit line control circuit 2 according to the third embodiment with the reset transistors according to the fifth embodiment will be described. FIG. 16 illustrates the arrangement of a bit line control circuit 2 according to the embodiment. The bit line control circuit 2 includes a charge control circuit 2-1, clamp transistors NMOS0, NMOS1, NMOS2, NMOS00, NMOS10, and NMOS20, reset transistors NMOS01, NMOS11, and NMOS21, sense amplifiers SA0, SA1, and SA2, and switches SW0, /SW0, SW1, /SW1, SW2, and /SW2.

The other terminal of the clamp transistor NMOS0 and the other terminal of the clamp transistor NMOS00 are connected to the sense amplifier SA0 via the switch SW0. The other terminal of the clamp transistor NMOS0 and the other terminal of the clamp transistor NMOS00 are also connected to an RST potential via the switch /SW0. The switches SW0 and /SW0 are on/off-controlled based on data 0 that is a result of determination of the potential of a bit line BL0 by the sense amplifier SA0. One terminal of the reset transistor NMOS01 is connected to the bit line BL0, one terminal of the clamp transistor NMOS0, and one terminal of the clamp transistor NMOS00.

The other terminal of the clamp transistor NMOS1 and the other terminal of the clamp transistor NMOS10 are connected to the sense amplifier SA1 via the switch SW1. The other terminal of the clamp transistor NMOS1 and the other terminal of the clamp transistor NMOS10 are also connected to an RST potential via the switch /SW1. The switches SW1 and /SW1 are on/off-controlled based on data 1 that is a result of determination of the potential of a bit line BL1 by the sense amplifier SA1. One terminal of the reset transistor NMOS11 is connected to the bit line BL1, one terminal of the clamp transistor NMOS1, and one terminal of the clamp transistor NMOS10.

The other terminal of the clamp transistor NMOS2 and the other terminal of the clamp transistor NMOS20 are connected to the sense amplifier SA2 via the switch SW2. The other terminal of the clamp transistor NMOS2 and the other terminal of the clamp transistor NMOS20 are also connected to an RST potential via the switch /SW2. The switches SW2 and /SW2 are on/off-controlled based on data 2 that is a result of determination of the potential of a bit line BL2 by the sense amplifier SA2. One terminal of the reset transistor NMOS21 is connected to the bit line BL2, one terminal of the clamp transistor NMOS2, and one terminal of the clamp transistor NMOS20.

A gate signal Clamp_D controls the gates of the clamp transistors NMOS0, NMOS1, and NMOS2. A gate signal Clamp_D0 controls the gates of the clamp transistors NMOS00, NMOS10, and NMOS20. A gate signal RST controls the gates of the reset transistors NMOS01, NMOS11, and NMOS21. The charge control circuit 2-1 controls the gate signals Clamp_D, Clamp_D0, and RST so as to on/off-control the transistors at timings corresponding to control waveforms to be described later with reference to FIG. 17.

Figure 17:
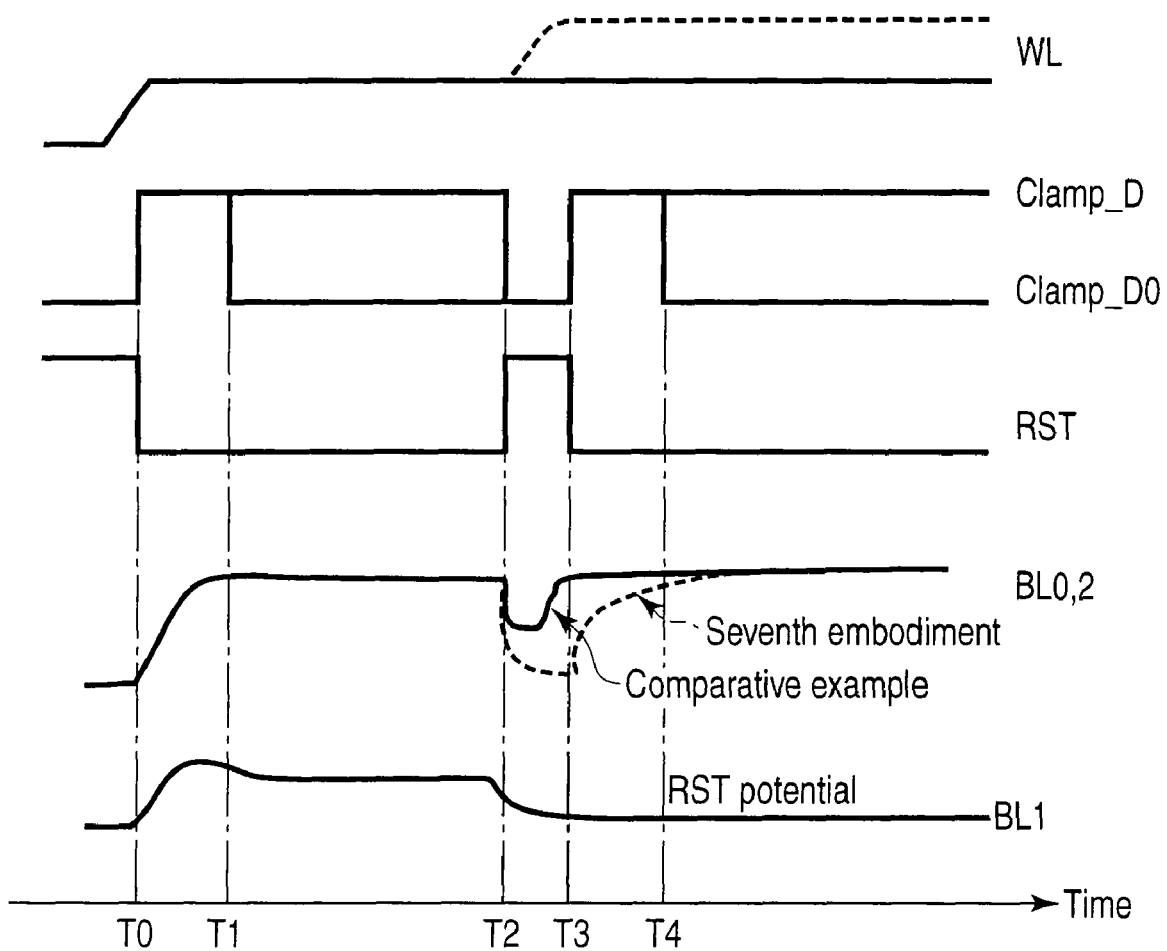
FIG. 17 is a timing chart showing the operation of the nonvolatile semiconductor memory device according to the seventh embodiment.

FIG. 17 shows control waveforms when executing read a plurality of number of times at the same word line potential using the lock-out operation. The lock-out operation makes the potential of the bit line BL1 connected to a memory cell MC1 in the ON state transit to the RST potential (for example, ground potential). Hence, the adjacent bit lines BL0 and BL2 connected to memory cells MC0 and MC2 in the OFF state change their potential, and therefore need to be recharged.

In the read operation, when a row decoder 6 starts applying a predetermined read voltage to the selected word line WL, the bit line control circuit 2 simultaneously raises the gate signals Clamp_D and Clamp_D0 to turn on the clamp transistors NMOS0, NMOS1, NMOS2, NMOS00, NMOS10, and NMOS20, and lowers the gate signal RST to turn off the reset transistors NMOS01, NMOS11, and NMOS21. Charge of the bit lines BL0 to BL2 thus starts (time T0).

After the elapse of a predetermined period from the time T0, the bit line control circuit 2 lowers only the gate signal Clamp_D0 to turn off the clamp transistors NMOS00, NMOS10, and NMOS20 (time T1). After that, the bit line control circuit 2 confirms the data determination result of a sense amplifier SA in the first read operation.

Even when the potential of the word line WL does not switch in the read operation, the bit line control circuit 2 lowers the gate signal Clamp_D at the timing of lock-out operation to turn off the clamp transistors NMOS0, NMOS1, and NMOS2, and raises the gate signal RST to turn on the reset transistors NMOS01, NMOS11, and NMOS21. The potentials of the bit lines BL0 to BL2 are thus initialized (time T2).

After the elapse of a predetermined period from the time T2, the bit line control circuit 2 raises the gate signals Clamp_D and Clamp_D0 to turn on the clamp transistors NMOS0, NMOS1, NMOS2, NMOS00, NMOS10, and NMOS20, and lowers the gate signal RST to turn off the reset transistors NMOS01, NMOS11, and NMOS21. Recharge of the bit lines BL0 to BL2 thus starts (time T3).

After the elapse of a predetermined period from the time T3, the bit line control circuit 2 lowers only the gate signal Clamp_D0 to turn off the clamp transistors NMOS00, NMOS10, and NMOS20 (time T4). This embodiment exemplifies a case in which data held in the memory cell MC1 in the ON state is confirmed in the first read operation, and the bit line BL1 is fixed at the RST potential by the lock-out operation.

As described above, according to the bit line control circuit 2 of this embodiment, even when the potential of the word line WL does not switch in the read operation, the gate signal Clamp_D0 is raised again at the timing of lock-out operation to operate the clamp transistors NMOS00, NMOS10, and NMOS20 to quickly recharge the bit lines. This makes it possible to recharge the bit line BL connected to the memory cell MC in the OFF state in a shorter time and thus charge and stabilize the bit line BL arranged adjacent to that bit line and connected to the memory cell MC in the ON state in a shorter time.

In addition, according to the bit line control circuit 2 of this embodiment, it is possible to initialize the bit line potential in second or subsequent read in which the lock-out operation is performed, and facilitate uniform control in both a case in which the bit line potential changes due to the lock-out operation and a case in which the bit line potential does not change.

Eighth Embodiment

In this embodiment, the internal arrangement of the sense amplifier SA described in the first to seventh embodiments will be described in detail. FIG. 18 illustrates a bit line control circuit 2 according to the embodiment. Although only the internal arrangement of a sense amplifier SA0 connected to a bit line BL0 is illustrated in detail for the descriptive convenience, remaining sense amplifiers SA1 and SA2 also have the same arrangement.

The bit line control circuit 2 includes a charge control circuit 2-1, clamp transistors NMOS0, NMOS1, and NMOS2 that fix the potentials of bit lines BL, and the sense amplifiers SA0, SA1, and SA2. One terminal of the clamp transistor NMOS0 is connected to the bit line BL0, and the other terminal is connected to a node node_sa in the sense amplifier SA0.

The sense amplifier SA0 includes a clamp transistor NMOS0$a$ having one terminal connected to the node node_sa and the other terminal connected to a power supply voltage Vdd so as to fix the potential of the node node_sa, a clamp transistor NMOS0$b$ having one terminal connected to the node node_sa and the other terminal connected to a node node_sen so as to fix the potential of the node node_sa, a switch transistor NMOS0$c$ having one terminal connected to the node node_sen and the other terminal connected to the power supply voltage Vdd, and an inverter inv0 connected to the node node_sen. The node node_sen has a capacitor CAP0.

The clamp transistors NMOS0, NMOS0$a$, and NMOS0$b$ are formed from transistors with a large gate length L to suppress a threshold variation, and have the same size. However, the current driving capability of the clamp transistors NMOS0, NMOS0$a$, and NMOS0$b$ is low because of the large gate length L.

On the other hand, the switch transistor NMOS0$c$ need only have a switch function, and is therefore formed from a transistor whose gate length L is smaller than that of the clamp transistors NMOS0, NMOS0$a$, and NMOS0$b$. The current driving capability of the switch transistor NMOS0$c$ is higher than that of the clamp transistors NMOS0, NMOS0$a$, and NMOS0$b$ because the gate length L is small.

Gate signals Clamp_D, Clamp_E, and Clamp_F control the gates of the clamp transistors NMOS0, NMOS0$a$, and NMOS0$b$, respectively. A gate signal SW controls the gate of the switch transistor NMOS0$c$. The charge control circuit 2-1 in the bit line control circuit 2 controls the gate signals Clamp_D, Clamp_E, Clamp_F, and SW to charge the bit line BL0, and detects and determines a memory cell current Icell0 flowing through a memory cell MC0.

FIG. 19 shows control waveforms in a read operation by the sense amplifier SA shown in FIG. 18 (the sense scheme of a comparative example). At the start of the read operation, the bit line control circuit 2 sets the gate signal Clamp_D of the clamp transistor NMOS0 to the lowest voltage (vblc+vthn), the gate signal Clamp_E of the clamp transistor NMOS0$a$ to a voltage (vsac+vthn) higher than the gate signal Clamp_D, the gate signal Clamp_F of the clamp transistor NMOS0$b$ to a voltage (vsax+vthn) higher than the gate signal Clamp_E, and the gate signal SW of the switch transistor NMOS0c to a voltage (vdd+vthn) higher than the gate signal Clamp_F (time T0).

That is, the voltage relationship between the gate signals satisfies Clamp_D (vblc+vthn)<Clamp_E (vsac+vthn) <Clamp_F (vsax+vthn)<SW (vdd+vthn), where vthn is the threshold voltage of the clamp transistors NMOS0, NMOS0a, and NMOS0b and the switch transistor NMOS0c.

At the start of the read operation, the bit line control circuit 2 raises the gate signals Clamp_D, Clamp_E, Clamp_F, and SW to turn on the clamp transistors NMOS0, NMOS0a, and NMOS0b and the switch transistor NMOS0c, thereby starting charging the bit line BL0 (time T0).

When sensing the memory cell current Icell0 flowing through the memory cell MC0 after the charge of the bit line BL0, the bit line control circuit 2 first lowers the gate signal SW to turn off the switch transistor NMOS0c. At this time, the potential difference between the gate signal Clamp_F (vsax+vthn) of the clamp transistor NMOS0b and the gate signal Clamp_E (vsac+vthn) of the clamp transistor NMOS0a enables to efficiently discharge the node node_sen (time T1).

After the elapse of a predetermined period (sense period) from the time T1, the bit line control circuit 2 lowers the gate signal Clamp_F to turn off the clamp transistor NMOS0b, thereby confirming the potential of the node node_sen and performing a sense operation. The determination result of the sense operation is output from a terminal OUT0 via the inverter inv0 (time T2).

During the read operation, the clamp transistor NMOS0a always holds the potential of the node node_sa. The potential is held almost constant, although it changes from vsax to vsac through the sense period. Hence, the clamp transistor NMOS0 can hold the bit line BL0 at vblc.

Figure 20:
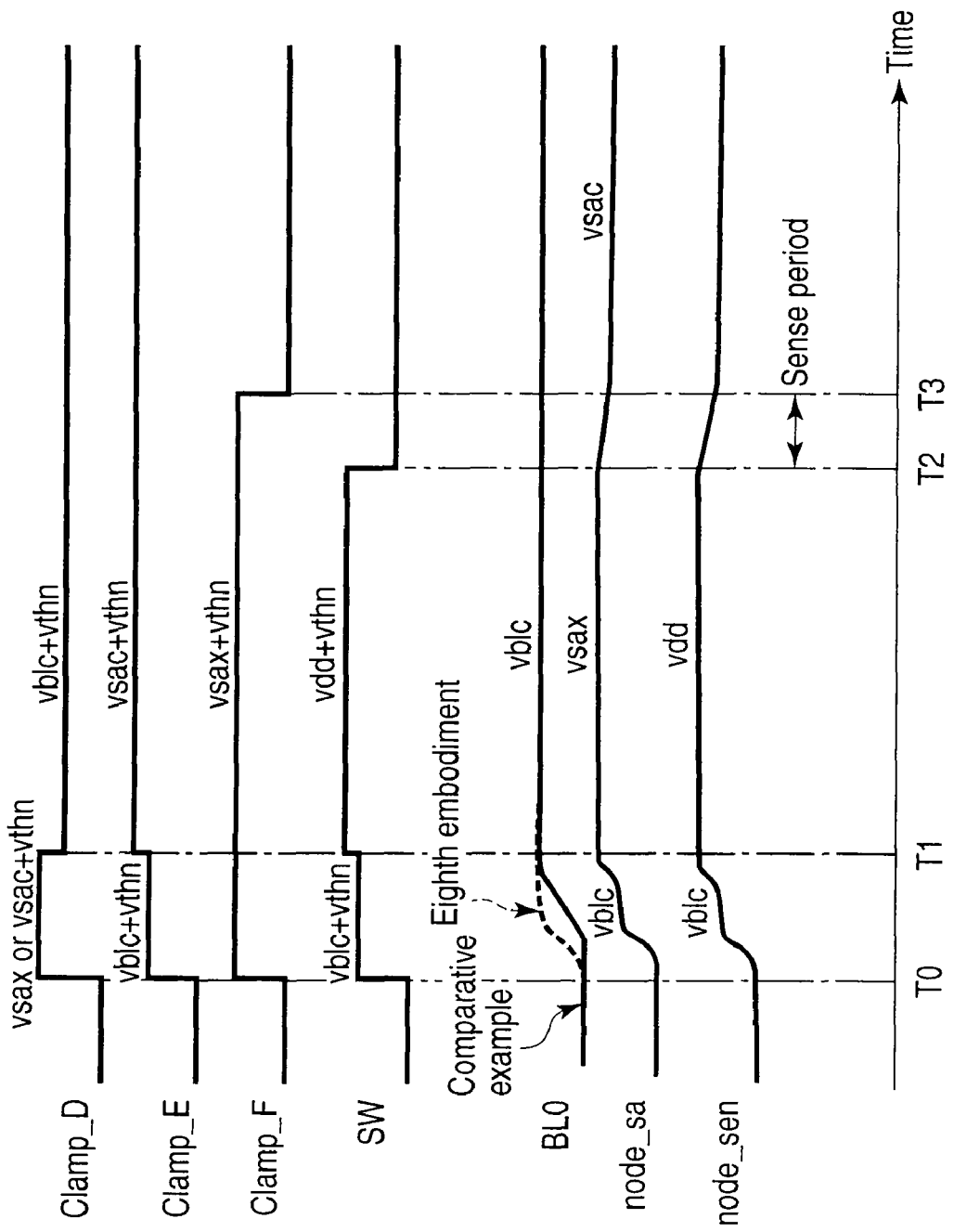
FIG. 20 is a timing chart showing the operation of the nonvolatile semiconductor memory device according to the eighth embodiment.

FIG. 20 shows control waveforms in a read operation by the sense amplifier SA shown in FIG. 18 (the sense scheme of this embodiment). This control can further improve the charge capability of the bit lines BL in the sense amplifier SA having the same arrangement as in FIG. 18, as compared to the sense scheme of the comparative example shown in FIG. 19.

In the early stage of charging the bit line BL at the start of the read operation, the bit line control circuit 2 raises the potential of the gate signal Clamp_D of the clamp transistor NMOS0 to (vsax+vthn) or (vsac+vthn), the potential of the gate signal Clamp_E of the clamp transistor NMOS0a to (vblc+vthn), and the potential of the gate signal SW of the switch transistor NMOS0c to (vblc+vthn). In addition, the bit line control circuit 2 raises the potential of the gate signal Clamp_F of the clamp transistor NMOS0b to (vsax+vthn), as in the comparative example. Performing this control in the early stage of charging the bit line BL makes it possible to increase the current driving capability and quickly charge the bit line BL while fixing its potential at vblc (time T0).

After the elapse of a predetermined period from the time T0, the bit line control circuit 2 lowers the potential of the gate signal Clamp_D of the clamp transistor NMOS0 to (vblc+vthn), raises the potential of the gate signal Clamp_E of the clamp transistor NMOS0a to (vsac+vthn), and raises the potential of the gate signal SW of the switch transistor NMOS0c to (vdd+vthn). This allows to hold the final potential (operating point) of the bit line BL0 at the same value as in the comparative example (time T1).

When sensing the memory cell current Icell0 flowing through the memory cell MC0 after the charge of the bit line BL0, the bit line control circuit 2 first lowers the gate signal SW to turn off the switch transistor NMOS0c (time T2).

After the elapse of a predetermined period (sense period) from the time T2, the bit line control circuit 2 lowers the gate signal Clamp_F to turn off the clamp transistor NMOS0b, thereby confirming the potential of the node node_sen and performing a sense operation (time T3).

As described above, according to the bit line control circuit 2 of this embodiment, it is possible to hold the operating point of the bit line BL to be sensed while quickly charging the bit line BL. Note that the sense amplifier SA according to this embodiment can be used in combination with one of the first to seventh embodiments, or solely without combining another embodiment. The sense amplifier SA may also be used in combination with one or more constituent elements extracted from one of the first to seventh embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising:
   a memory cell transistor configured to electrically rewrite data;
   a word line connected to a gate of the memory cell transistor;
   a row decoder which applies a read voltage to the word line;
   a bit line connected to a drain of the memory cell transistor;
   a sense amplifier which determines data in the memory cell transistor via the bit line;
   a first bit line clamp transistor connected in series between the bit line and the sense amplifier;
   a second bit line clamp transistor connected in parallel to the first bit line clamp transistor; and
   a bit line control circuit which turns on the first bit line clamp transistor and the second bit line clamp transistor as a first charge operation of the bit line during a first period from a start of charge of the bit line, and turns off only the second bit line clamp transistor as a second charge operation of the bit line after the first period, a charging of the bit line in the first charge operation being quicker than a charging of the bit line in the second charge operation.

2. The device of claim 1, wherein
   the row decoder is configured to continuously read out the data held by the memory cell transistor by switching a potential of the word line from a first read voltage to a second read voltage higher than the first read voltage, and
   the bit line control circuit turns on the first bit line clamp transistor and the second bit line clamp transistor using the common gate voltage during a predetermined period that the potential of the word line switches from the first read voltage to the second read voltage, and turns off only the second bit line clamp transistor when the predetermined period has elapsed.

3. The device of claim 2, further comprising a reset transistor including a first terminal connected to the bit line and a second terminal connected to an initial potential,
   wherein the bit line control circuit turns off the first bit line clamp transistor and turns on the reset transistor before the start of charge of the bit line when the potential of the word line switches from the first read voltage to the second read voltage, and turns on the first bit line clamp transistor and turns off the reset transistor when the predetermined period has elapsed.

4. The device of claim 1, further comprising:
a first switch connected between the sense amplifier and the first bit line clamp transistor and the second bit line clamp transistor so as to disconnect the bit line from the sense amplifier in accordance with the data determined by the sense amplifier; and
a second switch connected between an initial potential and the first bit line clamp transistor and the second bit line clamp transistor so as to connect the bit line to the initial potential in accordance with the data determined by the sense amplifier.

5. The device of claim 4, further comprising a reset transistor including a first terminal connected to the bit line and a second terminal connected to the initial potential,
wherein the row decoder is configured to maintain a single read voltage to continuously reread data after changeover between the first switch and the second switch in accordance with the data determined by the sense amplifier, and
the bit line control circuit turns off the first bit line clamp transistor and turns on the reset transistor before the start of charge of the bit line when executing the reread, and turns on the first bit line clamp transistor and turns off the reset transistor when the predetermined period has elapsed.

6. The device of claim 4, wherein
the row decoder is configured to maintain a single read voltage to continuously reread data after changeover between the first switch and the second switch in accordance with the data determined by the sense amplifier, and
the bit line control circuit turns on the first bit line clamp transistor and the second bit line clamp transistor using the common gate voltage when executing the reread, and turns off only the second bit line clamp transistor when the predetermined period has elapsed.

* * * * *